United States Patent
Kim et al.

(10) Patent No.: US 11,211,011 B2
(45) Date of Patent: Dec. 28, 2021

(54) DISPLAY DEVICE FOR IMPROVING DISPLAY QUALITY

(71) Applicant: Samsung Display Co., Ltd., Yongin-Si (KR)

(72) Inventors: Hyun Joon Kim, Yongin-si (KR); Jun Ki Jeong, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/035,846

(22) Filed: Sep. 29, 2020

(65) Prior Publication Data

US 2021/0312868 A1    Oct. 7, 2021

(30) Foreign Application Priority Data

Apr. 6, 2020  (KR) .......................... 10-2020-0041664

(51) Int. Cl.
*G09G 3/30* (2006.01)
*G09G 3/3266* (2016.01)
*H01L 27/32* (2006.01)

(52) U.S. Cl.
CPC ....... *G09G 3/3266* (2013.01); *H01L 27/3262* (2013.01); *H01L 27/3276* (2013.01)

(58) Field of Classification Search
CPC ... G09G 3/32; G09G 3/30; G09G 5/00; H01L 27/32; H01L 27/3276; H01L 27/3262; G06F 3/038
See application file for complete search history.

(56) References Cited

U.S. PATENT DOCUMENTS

| | | |
|---|---|---|
| 9,576,535 B2 | 2/2017 | Park et al. |
| 10,311,782 B2 | 6/2019 | Rieutort-Louis et al. |
| 10,373,557 B2 | 8/2019 | Zhu et al. |
| 10,847,090 B2 * | 11/2020 | Rha ...................... G09G 3/3291 |
| 2015/0049126 A1 * | 2/2015 | Jung ................... G09G 3/3233 345/690 |
| 2018/0144684 A1 * | 5/2018 | Jeon .................... H01L 27/3276 |
| 2018/0293939 A1 * | 10/2018 | Kim .................... H01L 27/3276 |
| 2019/0237010 A1 | 8/2019 | Lin et al. |
| 2020/0394961 A1 | 12/2020 | Kim et al. |
| 2021/0020109 A1 * | 1/2021 | Lin ..................... H01L 29/7869 |
| 2021/0027696 A1 | 1/2021 | Kim et al. |
| 2021/0125543 A1 | 4/2021 | Kim et al. |

FOREIGN PATENT DOCUMENTS

| | | |
|---|---|---|
| CN | 104485071 B | 8/2017 |
| CN | 107610651 B | 11/2019 |
| KR | 10-2020-0142646 A | 12/2020 |
| KR | 10-2021-0013509 A | 2/2021 |
| KR | 10-2021-0050050 A | 5/2021 |

* cited by examiner

*Primary Examiner* — Pegeman Karimi
(74) *Attorney, Agent, or Firm* — Innovation Counsel LLP

(57) ABSTRACT

The present inventive concept relates to a display device. Specifically, the display device according to an embodiment of the present inventive concept includes pixels; a scan driver supplying a first scan signal, a third scan signal, and a fourth scan signal at a first frequency and supplying a second scan signal at a second frequency that is a divisor of the first frequency; a data driver supplying a data signal at the second frequency; an emission driver supplying an emission control signal at the first frequency; and a timing controller.

19 Claims, 14 Drawing Sheets

<Display scan>

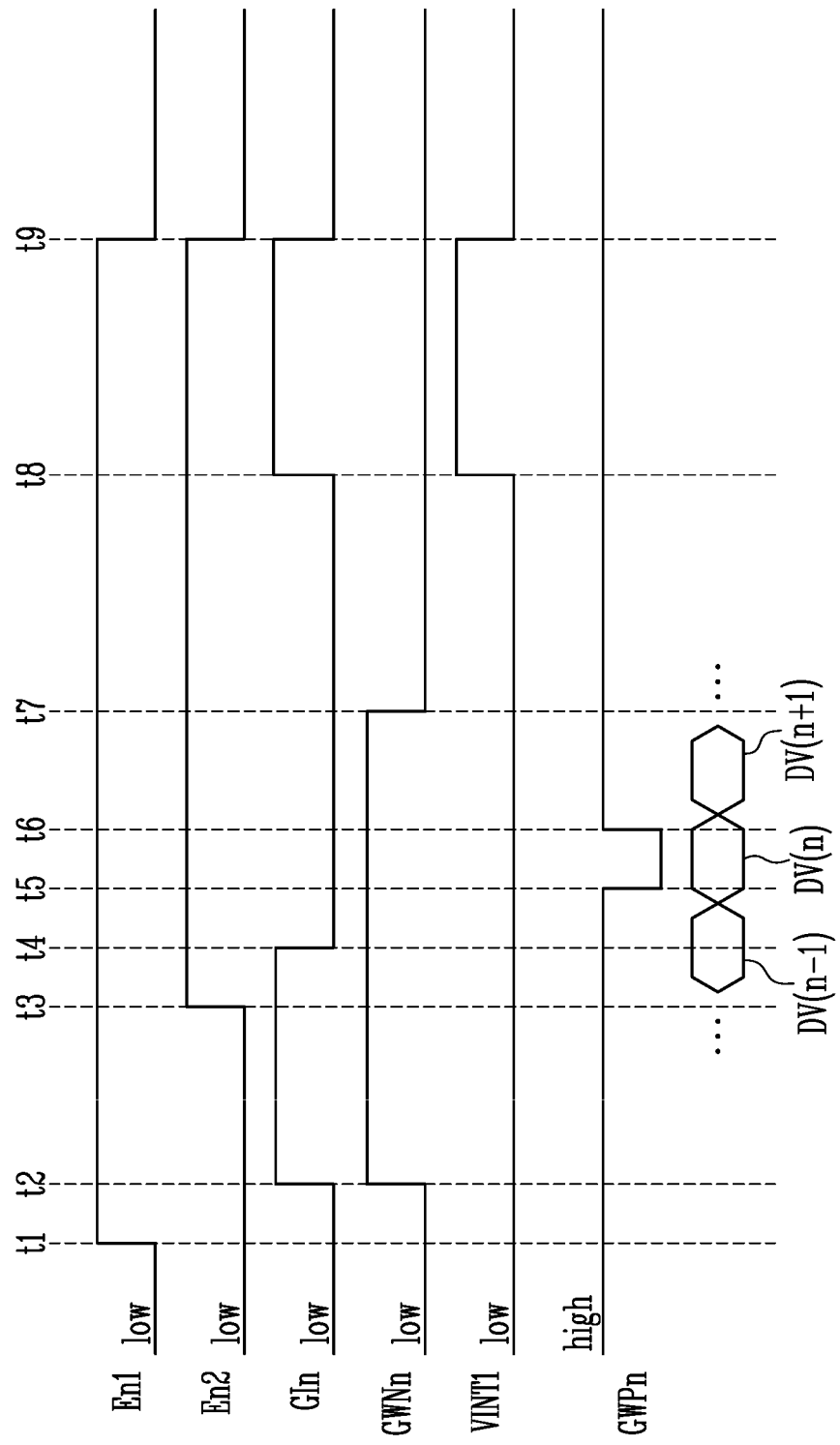

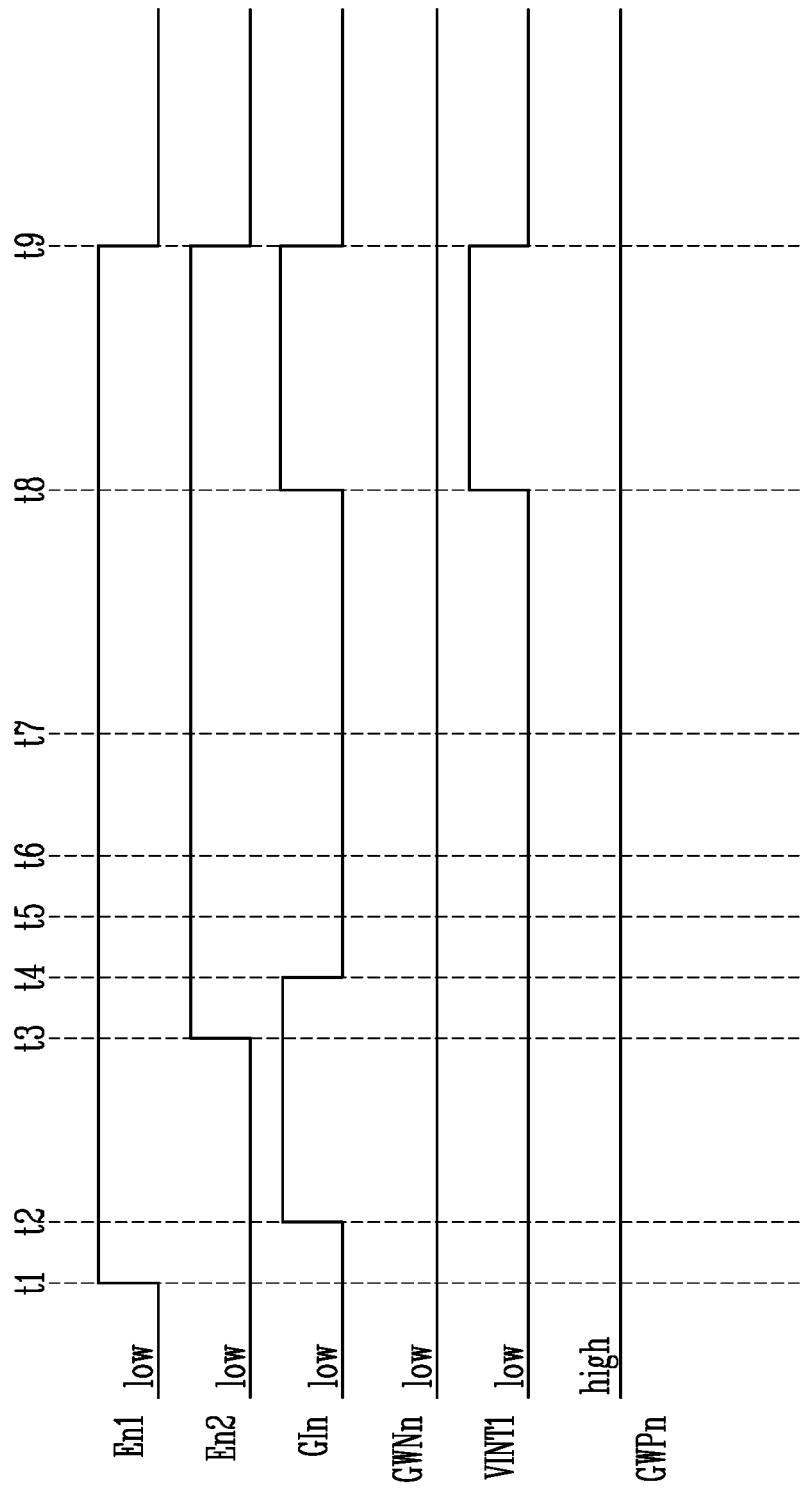

DISPLAY DEVICE FOR IMPROVING DISPLAY QUALITY

CROSS-REFERENCE TO RELATED APPLICATION

The application claims priority to and the benefit of Korean Patent Application No. 10-2020-0041664, filed Apr. 6, 2020, which is hereby incorporated by reference for all purposes as if fully set forth herein.

BACKGROUND

Field

The present inventive concept relates to a display device.

Discussion

Recently, various flat panel display devices capable of reducing weight and volume have been developed. The flat panel display device includes a liquid crystal display device, a field emission display device, a plasma display panel, an organic light emitting display device, and the like.

The organic light emitting display device displays an image using an organic light emitting diode in which light is generated by recombination of electrons and holes. The organic light emitting display device has an advantage of having a fast response speed and being driven with low power consumption.

Such a display device includes a data driver supplying data signals to data lines, a scan driver sequentially supplying scan signals to scan lines, a display area including a plurality of pixels connected to the scan lines and the data lines.

A pixel is selected when a scan signal is supplied to a scan line and receives a data signal from a data line. The pixel displays an image while generating light having a predetermined luminance corresponding to the data signal.

Recently, a method of driving a display device at a low frequency is used to improve driving efficiency of the display device and minimize power consumption. Accordingly, there is a need for a method capable of improving display quality when the display device is driven at the low frequency.

SUMMARY

A technical problem to be solved by the present inventive concept is to provide a display device capable of minimizing a difference in luminance even when a driving frequency is changed.

In addition, another technical problem to be solved by the present inventive concept is to provide a display device capable of improving (removing) hysteresis (a difference in threshold voltage shift) due to a difference in on-bias (and a difference in grayscale) between adjacent pixels and screen dragging (ghost phenomenon) due to a deviation in hysteresis by periodically applying a bias of a constant voltage to a driving transistor regardless of a data signal and a grayscale of an image.

Technical problems of the present inventive concept are not limited to the technical problems mentioned above. Other technical problems not mentioned will be clearly understood by those skilled in the art from the following description.

In order to solve the aforementioned technical problems, in one aspect, a display device according to an embodiment of the present inventive concept may include: pixels connected to first scan lines, second scan lines, third scan lines, data lines, and emission control lines; and an initialization voltage supply circuit supplying an initialization voltage to the pixels. Each of the pixels may include: a light emitting diode; a first transistor including a first electrode connected to a first node that is electrically connected to a first power source line, a gate electrode connected to a second node, and a second electrode connected to a third node; a second transistor connected between a data line and the first node and including a gate electrode connected to a third scan line; a third transistor connected between the second node and the third node and including a gate electrode connected to a second scan line; and a fourth transistor connected between the third node and a first initialization voltage line and including a gate electrode connected to a first scan line. The fourth transistor may be turned on during a first period and a second period, and the initialization voltage supply circuit may supply a first initialization voltage of a first level during the first period, and supply the first initialization voltage of a second level higher than the first level during the second period.

In an embodiment, the each of the pixels may further include: a fifth transistor connected between the first power source line and the first node and including a gate electrode connected to an emission control line; and a sixth transistor connected between the third node and a fourth node that is connected to a first electrode of the light emitting diode and including a gate electrode connected to the emission control line.

In an embodiment, a first scan signal having a turn-on level may be supplied to the first scan line during the first period after the emission control signal having a turn-off level is supplied to the fifth transistor and the sixth transistor, a second scan signal having the turn-on level may be supplied to the second scan line during a period overlapping at least a portion of the first period, and the first initialization voltage of the first level may be applied to the second node during a period in which the first scan signal and the second scan signal having the turn-on level are supplied.

In an embodiment, a third scan signal having of the turn-on level may be supplied to the third scan line during a period between the first period and the second period, and a data signal may be applied to the first node during a period in which the third scan signal having the turn-on level is supplied.

In an embodiment, the supply of the second scan signal having the turn-on level may be stopped after the period in which the third scan signal having the turn-on level is supplied, and the first scan signal having the turn-on level may be supplied during the second period after the supply of the second scan signal having the turn-on level is stopped.

In an embodiment, the first initialization voltage may be changed from the first level to the second level in synchronized with a time when the first scan signal having the turn-on level is supplied.

In an embodiment, the each of the pixels may further include a seventh transistor connected between the fourth node and a second initialization voltage line and including a gate electrode connected to a fourth scan line.

In an embodiment, a fourth scan signal having the turn-on level may be supplied to the fourth scan line after the first period, and a second initialization voltage may be applied to the fourth node through the second initialization voltage line in a period in which the fourth scan signal having the turn-on level is supplied.

In an embodiment, the fourth scan signal may be the same as the third scan signal.

In an embodiment, the third transistor may be an oxide semiconductor transistor, and the first transistor, the second transistor, the fourth transistor, the fifth transistor, and the sixth transistor may be polysilicon semiconductor transistors.

In an embodiment, the emission control line may include a first emission control line and a second emission control line, and the each of the pixels may further include: a fifth transistor connected between the first power source line and the first node and including a gate electrode connected to the first emission control line; and a sixth transistor connected between the third node and the first electrode of the light emitting diode and including a gate electrode connected to the second emission control line.

In an embodiment, the first scan signal having the turn-on level may be supplied to the first scan line during the first period after the first emission control signal having a turn-off level is supplied to the fifth transistor, the second scan signal having the turn-on level may be supplied to the second scan line during a period overlapping at least a portion of the first period, a second emission control signal having the turn-off level may be supplied to the second emission control line during a period overlapping at least a portion of the first period, and the first initialization voltage having the first level may be applied to the second node and the first electrode of the light emitting diode during a period in which the first scan signal, the second scan signal and the second emission control signal having the turn-on level is supplied.

In an embodiment, the third scan signal having the turn-on level may be supplied to the third scan line during a period between the first period and the second period, and the data signal may be applied to the first node during the period in which the third scan signal having the turn-on level is supplied.

In an embodiment, the supply of the second scan signal having the turn-on level may be stopped after the period in which the third scan signal having the turn-off level is supplied, and the first scan signal having the turn-on level may be supplied during the second period after the supply of the second scan signal having the turn-on level is stopped.

In an embodiment, the first initialization voltage may be changed from the first level to the second level in synchronized with when the first scan signal is supplied.

In an embodiment, the third transistor and the fourth transistor may be oxide semiconductor transistors, and the first transistor, the second transistor, the fifth transistor, and the sixth transistor may be polysilicon semiconductor transistors.

In an embodiment, the display device may further include: a first sub-scan driver for sequentially supplying first scan signals to the first scan lines at a first frequency; a second sub-scan driver for sequentially supplying second scan signals to the second scan lines at a second frequency; a third sub-scan driver for sequentially supplying third scan signals to the third scan lines at the first frequency; and a fourth sub-scan driver for sequentially supplying fourth scan signals to the fourth scan lines at the first frequency.

In an embodiment, the first sub-scan driver may supply a first scan signal a display scan period and a self-scan period included in one frame period, the second sub-scan driver may supply a second scan signal during the display scan period, and does not supply the second scan signal during the self-scan period, the third sub-scan driver may supply a third scan signal during the display scan period and the self-scan period, and the fourth sub-scan driver may supply a fourth scan signal during the display scan period and the self-scan period.

In an embodiment, the first frequency may be a multiple of the second frequency, and the second frequency may be a frequency corresponding to an image refresh rate of the pixels.

In an embodiment, the second level of the first initialization voltage may be equal to or higher than a level of a first power source voltage supplied to the first power source line.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 13 and 14 are timing diagrams for explaining a method of driving the pixel shown in FIG. 12.

DETAILED DESCRIPTION OF THE ILLUSTRATED EMBODIMENTS

Figure 1:
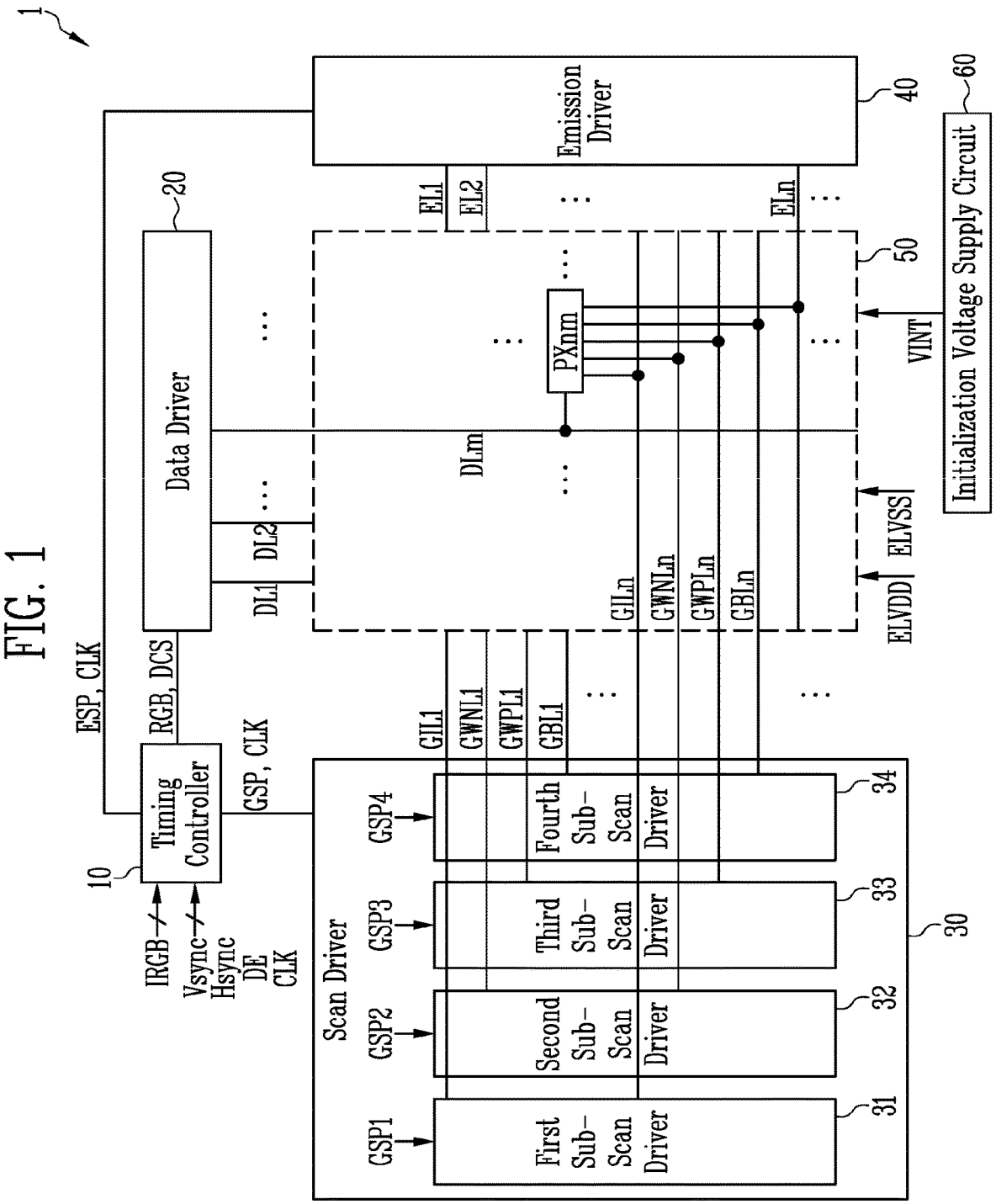
FIG. 1 is a block diagram illustrating a display device according to embodiments of the present inventive concept.

Advantages and features of the present inventive concept, and methods for accomplishing the same will be more clearly understood from exemplary embodiments described below with reference to the accompanying drawings. However, the present inventive concept is not limited to the following exemplary embodiments but may be implemented in various different forms. The exemplary embodiments are provided only to complete the disclosure of the present inventive concept and to fully inform a person having ordinary skill in the art to which the present inventive concept pertains the scope of the present inventive concept. The present inventive concept is only defined by the scope of the appended claims.

In assigning reference numerals to the components of each drawing, the same components may be assigned the same reference numerals as possible even though they are illustrated on different drawings. In addition, in describing the present inventive concept, when it is determined that detailed descriptions of related well-known configurations or functions may obscure the subject matter of the present inventive concept, detailed descriptions thereof may be omitted.

In describing the components of the inventive concept, terms such as first, second, A, B, (a), and (b) may be used. These terms are only used to distinguish one component from another components. The essence, order, or number of the components is not limited by the terms. When a component is described as being "connected" or "coupled" to another component, the component can be directly connected to or coupled to the another component. However, it should be understood that other components may be "interposed" between each component, or that each component may be "connected" or "coupled" through other components. Meanwhile, a singular expression may include a plural expression unless the context clearly indicates otherwise.

FIG. 1 is a block diagram illustrating a display device according to embodiments of the present inventive concept.

Referring to FIG. 1, a display device 1 according to embodiments of the present inventive concept may display images at various image refresh rates (a driving frequency, a screen update frequency, or a screen refresh rate) according to driving conditions. Here, the image refresh rate may mean a frequency at which data signals are substantially written to a driving transistor of a pixel PXnm. For example, the image refresh rate may be a screen refresh rate, a screen refresh frequency, and a screen update frequency, and may indicate a frequency at which a display screen is changed during one second.

In an embodiment, the display device 1 may adjust an output frequency of a scan driver 30 and an output frequency of a data driver 20 according to the driving conditions. For example, the display device 1 may display an image corresponding to various image refresh rates between 1 Hz and 120 Hz. However, this is an example, and the display device 1 may display the image even at the image refresh rate of 120 Hz or higher (for example, 240 Hz or 480 Hz).

The display device 1 may include a timing controller 10, the data driver 20, the scan driver 30, an emission driver 40, a display area 50, and an initialization voltage supply circuit 60.

The timing controller 10 may receive input image data IRGB and timing signals Vsync, Hsync, DE, and CLK from a host system such as an application processor (AP) through a predetermined interface. Here, the timing signals Vsync, Hsync, DE, and CLK may include, for example, a vertical synchronization signal Vsync, a horizontal synchronization signal Hsync, a data enable signal DE, and a clock signal CLK.

The vertical synchronization signal Vsync may include a plurality of pulses, and may indicate a starting time of a present frame period and an ending time of a previous frame period. An interval between adjacent pulses of the vertical synchronization signal Vsync may correspond to one frame period.

The horizontal synchronization signal Hsync may include a plurality of pulses, and may indicate an ending time of a previous horizontal period and a starting time of a new horizontal period. An interval between adjacent pulses of the horizontal synchronization signal Hsync may correspond to one horizontal period.

The data enable signal DE may have an enable level for specific horizontal periods. When the data enable signal DE is at the enable level, it may indicate that the input image data IRGB is supplied in corresponding horizontal periods.

The input image data IRGB may be supplied in units of pixel rows in each of the corresponding horizontal periods.

The timing controller 10 may rearrange the input image data IRGB and supply image data RGB to the data driver 20. Specifically, the timing controller 10 may generate the image data RGB corresponding to grayscale values based on the input image data IRGB to correspond to the specifications of the display device 1 and supply the image data RGB to the data driver 20.

In addition, the timing controller 10 may generate control signals to be supplied to the data driver 20, the scan driver 30, and the emission driver 40 based on the timing signals Vsync, Hsync, DE, and CLK to correspond to the specifications of the display device 1.

In an embodiment, the timing controller 10 may generate a data driving control signal DCS based on the timing signals Vsync, Hsync, DE, and CLK, and supply the data driving control signal DCS to the data driver 20.

The data driver 20 may convert the image data RGB which is rearranged into data signals (or data voltages) having an analog format. Specifically, the data driver 20 may generate the data signals (or data voltages) to be supplied to data lines DL1, DL2, and DLm using the image data RGB and the data driving control signal DCS received from the timing controller 10. For example, the data driver 20 may sample the grayscale values in response to the data driving control signal DCS, and supply the data signals (or data voltages) corresponding to the grayscale values to the data lines DL1, DL2, and DLm in units of pixel rows (for example, pixels connected to the same scan line).

The data driver 20 may supply the data signals to the data lines DL1, DL2, and DLm during one frame period in response to the scan signals according to the image refresh rate. The data signals supplied to the data lines DL1, DL2, and DLm may be supplied in synchronized with second scan signals supplied to second scan lines GWNL1 to GWNLn and third scan signals supplied to third scan lines GWPL1 to GWPLn (and/or fourth scan signals supplied to fourth scan lines GBL1 to GBLn).

Meanwhile, in an embodiment, the timing controller 10 may supply gate start pulses GSP and clock signals CLK to the scan driver 30 based on the timing signals Vsync, Hsync, DE, and CLK. Here, the gate start pulses GSP may be used to control a first timing of scan signals supplied from the scan driver 30, and the clock signals CLK may be used to shift the gate start pulses GSP.

The scan driver 30 may receive the clock signals CLK, the gate start pulses GSP, and the like from the timing controller 10 and generate the scan signals to be supplied to scan lines GIL1, GWNL1, GWPL1, GBL1, GILn, GWNLn, GWPLn, and GBLn, where n may be a natural number.

The scan driver 30 may include a plurality of sub-scan drivers 31, 32, 33, and 34. For example, the scan driver 30 may include a first sub-scan driver 31, a second sub-scan driver 32, a third sub-scan driver 33, and a fourth sub-scan driver 34. In this case, the gate start pulses GSP may include a first gate start pulse GSP1, a second gate start pulse GSP2, a third gate start pulse GSP3, and a fourth gate start pulse GSP4 which are supplied to the first sub-scan driver 31, the second sub-scan driver 32, the third sub-scan driver 33, and the fourth sub-scan driver 34, respectively. In this case, pulse widths of the gate start pulses GSP including the first gate start pulse GSP1, the second gate start pulse GSP2, the third gate start pulse GSP3, and the fourth gate start pulse GSP4 may be different, and widths of the scan signals corresponding thereto may also be different. Meanwhile, the plurality of sub-scan drivers 31, 32, 33, and 34 may receive the clock signals CLK in common.

The scan driver 30 and the gate start pulses GSP supplied to the scan drivers are explained as if they include separated scan drivers, for example, the first sub-scan driver 31, the second sub-scan driver 32, the third sub-scan driver 33, and the fourth sub-scan driver 34 and separate gate start pulses GSP, for example, the first gate start pulse GSP1, the second gate start pulse GSP2, the third gate start pulse GSP3, and the fourth gate start pulse GSP4 for convenience of explanation. Depending on the design, at least some of the scan driver 30 and the emission driver 40 may be integrated into one driving circuit, module, or the like.

In an embodiment, the first sub-scan driver 31 may sequentially supply first scan signals to first scan lines GIL1 to GILn in response to the first gate start pulse GSP1, the second sub-scan driver 32 may sequentially supply the second scan signals to the second scan lines GWNL1 to GWNLn in response to the second gate start pulse GSP2, the third sub-scan driver 33 may sequentially supply the third scan signals to the third scan lines GWPL1 to GWPLn in response to the third gate start pulse GSP3, and the fourth sub-scan driver 34 may sequentially supply the fourth scan signals to the fourth scan lines GBL1 to GBLn in response to the fourth gate start pulse GSP4. Each of the sub-scan drivers 31, 32, 33, and 34 may include a plurality of scan stages connected in the form of a shift register. For example, the scan signals may be generated by sequentially transmitting a pulse of a turn-on level of the gate start pulse GSP supplied to a scan start line to the next scan line.

In an embodiment, the first sub-scan driver 31, the third sub-scan driver 33, and the fourth sub-scan driver 34 may supply the scan signals to the scan lines GIL1, GILn, GWPL1, GWPLn, GBL1, and GBLn at a constant first frequency regardless of the image refresh rate of the display device 1.

In an embodiment, the first frequency may be greater than the image refresh rate of the display device 1. For example, the first frequency may be set to about twice the maximum image refresh rate of the display device 1 (the maximum driving frequency set in the display device 1). Specifically, when the maximum image refresh rate of the display device 1 is 120 Hz, the first frequency may be set to 240 Hz. Accordingly, within one frame period, a scanning operation in which the scan signals (for example, the first scan signals, the third scan signals, and the fourth scan signals) are sequentially output to the scan lines (for example, GIL1, GILn, GWPL1, GWPLn, GBL1, and GBLn) may be repeated a plurality of times.

For example, at all driving frequencies at which the display device 1 can be driven, the first sub-scan driver 31, the third sub-scan driver 33, and the fourth sub-scan driver 34 may perform scanning once during a display scan period, and may perform the scanning at least once during a self-scan period according to the image refresh rate. The number of repetitions of the scanning operation during the self-scan period is determined according to the image refresh rate. In this case, when the image refresh rate decreases, the number of repetitions of the scanning operation performed during the self-scan period within one frame period may be increased. When the image refresh rate increases, the number of repetitions of the scanning operation performed during the self-scan period within one frame period may be reduced.

In an embodiment, the first frequency may correspond to output frequencies of the first gate start pulse GSP1, the third gate start pulse GSP3, and the fourth gate start pulse GSP4 supplied from the timing controller 10 to the first sub-scan driver 31, the third sub-scan driver 33, and the fourth sub-scan driver 34, respectively. In this case, the output frequencies of the first gate start pulse GSP1, the third gate start pulse GSP3, and the fourth gate start pulse GSP4 may be the same.

Meanwhile, in an embodiment, the second sub-scan driver 32 may supply the second scan signals to the second scan lines GWNL1 to GWNLn at a second frequency.

In an embodiment, the second frequency may be the same frequency as the image refresh rate of the display device 1. For example, when the image refresh rate of the display device 1 is 120 Hz, the second frequency may be set to 120 Hz. In this case, within one frame period, the scanning operation in which the scan signals (for example, the second scan signals) are sequentially output to the scan lines (for example, GWNL1 to GWNLn) may be performed once. For example, at all driving frequencies at which the display device 1 can be driven, the second sub-scan driver 32 may perform the scanning operation once during the display scan period.

In an embodiment, the second frequency may be set to a divisor of the first frequency, and may correspond to an output frequency of the second gate start pulse GSP2 supplied from the timing controller 10 to the second sub-scan driver 32.

In an embodiment, the image refresh rate may be an output frequency of the second sub-scan driver 32 that supplies the second scan signals to the second scan lines GWNL1 to GWNLn.

According to an embodiment, the third sub-scan driver 33 and the fourth sub-scan driver 34 may merged into a single sub-scan driver. In this case, the third scan lines GWPL1 to GWPLn and the fourth scan lines GBL1 to GBLn may be connected to the same node and may receive the same gate start pulse. In this case, the third gate start pulse GSP3 and the fourth gate start pulse GSP4 may be the same. A sub-scan driver in which the third sub-scan driver 33 and the fourth sub-scan driver 34 are integrated may supply the scan signals to the scan lines GWPL1 to GWPLn and GBL1 to GBLn.

Meanwhile, in an embodiment, the fourth sub-scan driver 34 may be omitted according to a pixel structure of the pixel PXnm.

The scan signals may be set to a gate-on voltage (for example, a pulse of a turn-on level) so that the transistor included in the pixel PXnm is turned on.

In an embodiment, the scan signals may be signals having a pulse of a first polarity or a second polarity. In this case, the first polarity and the second polarity may be opposite polarities.

Hereinafter, polarity may mean a logic level of a pulse. For example, when the pulse is the first polarity, the pulse may have a high level. When the pulse of the first polarity is supplied to a gate electrode of an N-type transistor, the N-type transistor may be turned on. That is, the pulse of the first polarity may be a turn-on level for the N-type transistor. Here, it is assumed that a voltage sufficiently lower than the gate electrode is applied to a source electrode of the N-type transistor. For example, the N-type transistor may be an NMOS transistor.

In addition, when the pulse is the second polarity, the pulse may have a low level. When the pulse of the second polarity is supplied to a gate electrode of a P-type transistor, the P-type transistor may be turned on. That is, the pulse of the second polarity may be the turn-on level for the P-type transistor. Here, it is assumed that a voltage of a sufficiently higher than the gate electrode is applied to a source electrode of the P-type transistor. For example, the P-type transistor may be a PMOS transistor.

Meanwhile, in an embodiment, the timing controller 10 may supply an emission start pulse ESP and clock signals CLK to the emission driver 40 based on the timing signals Vsync, Hsync, DE, and CLK. The emission start pulse ESP may be used to control a first timing of emission control signals, and the clock signals CLK may be used to shift the emission start pulse ESP.

The emission driver 40 may receive the clock signals CLK and the emission start pulse ESP from the timing controller 10 to generate the emission control signals to be supplied to emission control lines EL1, EL2, and ELn. For example, the emission driver 40 may sequentially supply the emission control signals to the emission control lines EL1, EL2, and ELn. For example, the emission driver 40 may be configured in the form of a shift register.

In an embodiment, the emission control lines EL1, EL2 and ELn may be electrically connected to a plurality of pixels PXnm included in one horizontal line (pixel row), respectively. This will be described later with reference to FIG. 2.

In an embodiment, each of the emission control lines EL1, EL2 and ELn may include a first emission control line and a second emission control line, and the first emission control line and the second emission control line may be electrically connected to the plurality of pixels PXnm included in one horizontal line (pixel row), respectively. This will be described later with reference to FIG. 12.

When the emission control signals are sequentially supplied to the emission control lines EL1, EL2, and ELn, the pixels PXnm may not emit light in units of horizontal lines. To this end, the emission control signals may be set to a gate-off voltage (for example, a pulse of a turn-off level) so that some transistors included in the pixels PXnm are turned off.

In an embodiment, the emission driver 40 may supply the emission control signals to the emission control lines EL1, EL2, and ELn at the constant first frequency regardless of the image refresh rate of the display device 1. Therefore, within one frame period, an emission control signal supplied to each of the emission control lines EL1, EL2, and ELn may be repeatedly supplied every predetermined period. Accordingly, when the image refresh rate is reduced, the number of repetitions of an operation in which the emission control signal is supplied during one frame period may be increased.

The scan driver 30 and the emission driver 40 may be directly formed on a substrate through a thin film process, respectively. Further, the scan driver 30 and the emission driver 40 may be disposed on both sides with the display area 50 interposed therebetween. Meanwhile, when the scan driver 30 is divided into the first sub-scan driver 31 to the fourth sub-scan driver 34, the first sub-scan driver 31 to the fourth sub-scan driver 34 may also be disposed on both sides with the display area 50 interposed therebetween.

The display area 50 may include the pixels PXnm. For example, each of the pixels PXnm may be connected to corresponding data line DLm, scan lines GILn, GWNLn, GWPLn, and GBLn, and emission control line ELn. The pixels PXnm may be supplied with a first power source voltage ELVDD, a second power source voltage ELVSS, and an initialization voltage VINT from outside.

In an embodiment of the present inventive concept, signal lines GIL, GWNL, GWPL, GBL, DL, and EL connected to the pixels PXnm may be variously set corresponding to a circuit structure of the pixels PXnm.

Meanwhile, according to the circuit structure of the pixels PXnm, the pixels PXnm disposed in a current horizontal line (or current pixel row) may be further connected to a scan line disposed in a previous horizontal line (or previous pixel row) and/or a scan line disposed in a subsequent horizontal line (or subsequent pixel row). To this end, dummy scan lines and/or dummy emission control lines (not shown) may be additionally formed on a region adjacent to the display area 50.

The initialization voltage supply circuit 60 may receive a control signal (not shown) from the timing controller 10 and supply the initialization voltage VINT to the display area 50. Specifically, the initialization voltage supply circuit 60 may supply the initialization voltage VINT to an initialization voltage line (not shown). The initialization voltage VINT may be supplied to the plurality of pixels PXnm electrically connected to the initialization voltage line.

In an embodiment, the initialization voltage VINT may be a voltage for initializing a gate electrode of a first transistor included in the pixels PXnm, as will be described later.

In an embodiment, the initialization voltage VINT may be a bias voltage for causing the first transistor included in the pixels PXnm to be in an on-bias state, as will be described later.

In an embodiment, the initialization voltage VINT may be a voltage for initializing an anode of a light emitting diode included in the pixels PXnm, as will be described later.

Meanwhile, although not shown in FIG. 1, the display device 1 may further include a memory.

Figure 2:
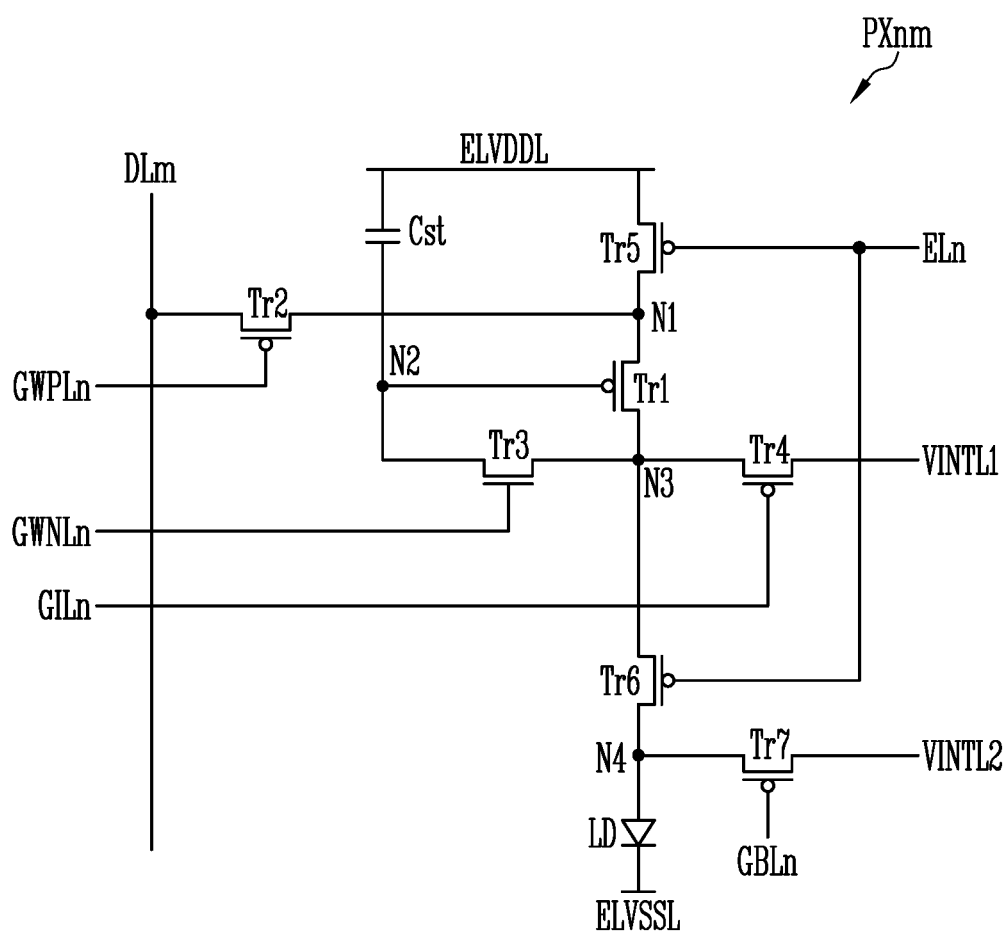
FIG. 2 is a circuit diagram of a pixel according to an embodiment of the present inventive concept.

FIG. 2 is a circuit diagram of a pixel according to an embodiment of the present inventive concept.

In FIG. 2, a pixel disposed on an n-th horizontal line and connected to an m-th data line DLm is shown for convenience of description.

Referring to FIG. 2, a pixel PXnm may include transistors Tr1 to Tr7, a storage capacitor Cst, and a light emitting diode LD.

A first transistor Tr1 may control a driving current based on a data signal. The first transistor Tr1 may be referred to as a driving transistor. A first electrode of the first transistor Tr1 may be connected to a first node N1, a second electrode of the first transistor Tr1 may be connected to a third node N3, and a gate electrode of the first transistor Tr1 may be connected to a second node N2. According to a voltage of the second node N2, the first transistor Tr1 may control the amount of driving current flowing through a first power source line ELVDDL having the first power source voltage ELVDD, a fifth transistor Tr5, the first transistor Tr1, a sixth transistor Tr6, the light emitting diode LD, and a second power source line ELVSSL having the second power source voltage ELVSS. To this end, the first power source voltage ELVDD may be set to be a voltage higher than the second power source voltage ELVSS.

A second transistor Tr2 may select the pixel PXnm to which the data signal is supplied based on a third scan signal supplied to a third scan line GWPLn. The second transistor Tr2 may be referred to as a scanning transistor. The second transistor Tr2 may be connected between the data line DLm and the first node N1. That is, a first electrode of the second transistor Tr2 may be connected to the data line DLm, a second electrode of the second transistor Tr2 may be connected to the first node N1, and a gate electrode of the second transistor Tr2 may be connected to the third scan line GWPLn. The second transistor Tr2 may be turned on when the third scan signal having a turn-on level pulse is supplied to the third scan line GWPLn to electrically connect the data line DLm and the first node N1.

A third transistor Tr3 may be connected between the second electrode of the first transistor Tr1 (that is, the third node N3) and the second node N2. That is, a first electrode of the third transistor Tr3 may be connected to the second node N2, a second electrode of the third transistor Tr3 may be connected to the third node N3, and a gate electrode of the third transistor Tr3 may be connected to a second scan line GWNLn. The third transistor Tr3 may be turned on when a second scan signal having the turn-on level pulse is supplied to the second scan line GWNLn to electrically connect the second electrode of the first transistor Tr1 (that is, the third node N3) and the second node N2. When the third transistor Tr3 is turned on, the first transistor Tr1 may be connected in the form of a diode. Accordingly, data writing and threshold voltage compensation for the first transistor Tr1 may be performed together.

A fourth transistor Tr4 may be connected between the third node N3 and a first initialization voltage line VINTL1. That is, a first electrode of the fourth transistor Tr4 may be connected to the third node N3, a second electrode of the fourth transistor Tr4 may be connected to the first initialization voltage line VINTL1, and a gate electrode of the fourth transistor Tr4 may be connected to a first scan line GILn. The fourth transistor Tr4 may be turned on when a first scan signal having the turn-on level pulse is supplied to the first scan line GILn to supply the first initialization voltage applied through the first initialization voltage line VINTL1 to the third node N3.

Here, as will be described later with reference to FIGS. 3 and 4, when the third transistor Tr3 and the fourth transistor Tr4 are turned on, the first initialization voltage applied to the third node N3 may be applied to the gate electrode of the first transistor Tr1. In this case, the first initialization voltage applied to the gate electrode of the first transistor Tr1 may be a low level voltage. Accordingly, the gate electrode of the first transistor Tr1 may be initialized.

Meanwhile, as will be described later with reference to FIGS. 3 and 4, when the third transistor Tr3 is turned off and the fourth transistor Tr4 is turned on, an initialization voltage may be applied to a drain electrode (and a source electrode) of the first transistor Tr1 as the bias voltage. At this time, the initialization voltage applied to the drain electrode (and the source electrode) of the first transistor Tr1 may be a high level voltage. In this case, the first transistor Tr1 may be in the on-bias state (that is, the first transistor Tr1 may be on-biased).

A fifth transistor Tr5 may be connected between the first power source line ELVDDL and the first node N1. A gate electrode of the fifth transistor Tr5 may be connected to an emission control line ELn. The fifth transistor Tr5 may be turned off when the emission control signal having a high level is supplied to the emission control line ELn, and may be turned on in other cases.

A sixth transistor Tr6 may be connected between the second electrode of the first transistor Tr1 (that is, the third node N3) and a first electrode of the light emitting diode LD (that is, the fourth node N4). A gate electrode of the sixth transistor Tr6 may be connected to the emission control line ELn. The sixth transistor Tr6 may be turned off when the emission control signal having a high level is supplied to the emission control line ELn, and may be turned on in other cases. Accordingly, the fifth transistor Tr5 and the sixth transistor Tr6 may be controlled (turned-on and turned-off) at the same time.

A seventh transistor Tr7 may be connected between the first electrode of the light emitting diode LD (that is, the fourth node N4) and the second initialization voltage VINTL2. A gate electrode of the seventh transistor Tr7 may be connected to a fourth scan line GBLn. The seventh transistor Tr7 may be turned on when a fourth scan signal having the turn-on level pulse is supplied to the fourth scan line GBLn to supply a second initialization voltage applied through a second initialization voltage line VINTL2 to the first electrode of the light emitting diode LD (that is, the fourth node N4).

Here, as will be described later with reference to FIGS. 3 and 4, when the seventh transistor Tr7 is turned on and the second initialization voltage is applied to the first electrode of the light emitting diode LD (that is, the fourth node N4) through the second initialization line VINTL2, the first electrode of the light emitting diode LD may be initialized.

In an embodiment, the second initialization voltage may be the same as the first initialization voltage. For example, the first initialization voltage and the second initialization voltage may be low-level voltages.

In an embodiment, the second initialization voltage may be the same as the first initialization voltage applied to an (n+1)th pixel row.

The first electrode (that is, an anode electrode) of the light emitting diode LD may be connected to the fourth node N4, and a second electrode (that is, a cathode electrode) of the light emitting diode LD may be connected to the second power source line ELVSSL of the second power voltage ELVSS. The light emitting diode LD may emit light with a predetermined luminance corresponding to the amount of current supplied from the first transistor Tr1.

In an embodiment, the light emitting diode LD may be an organic light emitting diode including an organic light emitting layer. In another embodiment, the light emitting diode LD may be an inorganic light emitting element formed of an inorganic material. Alternatively, the light emitting diode LD may have a shape in which a plurality of inorganic light emitting elements are connected in parallel and/or in series between the second power source line ELVSSL and the fourth node N4.

In general, the first power source voltage ELVDD may be greater than the second power source voltage ELVSS. However, in a special situation such as that the light emitting diode LD does not emit light, the second power source voltage ELVSS may be set greater than the first power source voltage ELVDD.

Meanwhile, when the second initialization voltage is supplied to the first electrode of the light emitting diode LD, a parasitic capacitor (not shown) of the light emitting diode LD may be discharged. As the residual voltage charged in the parasitic capacitor is discharged (removed), unintentional emitting of weak light can be prevented. Therefore, black expression ability of the pixel PXnm can be improved.

The storage capacitor Cst may charge the quantity of electric charge corresponding to a potential difference between the first power source voltage ELVDD applied to the first power source line ELVDDL and a voltage applied to the second node N2. The storage capacitor Cst may be connected between the first power source line ELVDDL and the second node N2. Specifically, a first electrode of the storage capacitor Cst may be connected to the first power source line ELVDDL and a second electrode of the storage capacitor Cst may be connected to the second node N2.

In an embodiment, the transistors Tr1 to Tr7 may be composed of a combination of an N-type transistor and a P-type transistor. Here, the N-type transistor generally refers to a transistor in which the amount of current to be conducted increases when a voltage difference between the gate electrode and the source electrode increases in a positive direction. The P-type transistor generally refers to a transistor in which the amount of current to be conducted increases when a voltage difference between the gate electrode and the source electrode increases in a negative direction.

For example, the first transistor Tr1, the second transistor Tr2, the fourth transistor Tr4, the fifth transistor Tr5, the sixth transistor Tr6, and the seventh transistor Tr7 may be P-type transistors, and the third transistor Tr3 may be an N-type transistor. However, the present inventive concept is not limited thereto. Meanwhile, when the transistors are formed on the substrate, the size of the N-type transistor may be larger than the size of the P-type transistor. Therefore, when the fourth transistor Tr4 is designed as the P-type transistor, integration of a pixel circuit can be implemented when compared to a case where the fourth transistor Tr4 is designed as the N-type transistor. In addition, a pixel including the fourth transistor Tr4 designed as the P-type transistor has an advantage that can be applied to the display device 1 having a high resolution and a large screen.

In an embodiment, the N-type transistor may be an oxide semiconductor transistor, and the P-type transistor may be a polysilicon semiconductor transistor. For example, the third transistor Tr3 may include an active layer formed of an oxide such as In—Ga—Zn-Oxygen (IGZO). That is, the third transistor Tr3 may be the oxide semiconductor transistor. In another embodiment, the first transistor Tr1, the second transistor Tr2, and the fourth transistor Tr4 to the seventh transistor Tr7 may include an active layer (channel) formed through a low temperature poly-silicon (LTPS) process. That is, the first transistor Tr1, the second transistor Tr2, and the fourth transistor Tr4 to the seventh transistor Tr7 may be polysilicon semiconductor transistors.

On the other hand, when the first transistor Tr1 is the P-type transistor, a difference in luminance due to a change in hysteresis of the first transistor Tr1 in a corresponding frame period according to a change in driving frequency may be visually recognized by a user. In particular, in a low frequency driving in which a length of one frame period is long, when the first initialization voltage supplied to the second node N2 is too low, the change in hysteresis of the first transistor Tr1 in the corresponding frame period may be intensified. This change in hysteresis may cause flicker in the low frequency driving.

To improve this problem, the pixel PXnm according to the embodiments of the present inventive concept and the display device 1 including the same may periodically apply the bias voltage of a constant voltage, for example, the first initialization voltage, to the drain electrode (and/or the source electrode) of the first transistor Tr1 using the fourth transistor Tr4. Accordingly, a deviation in hysteresis due to a difference in grayscale between adjacent pixels can be eliminated, and screen dragging caused by this can be reduced (removed).

Hereinafter, a method of driving the pixel according to an embodiment of the present inventive concept will be described in detail with reference to a timing diagram.

Figure 3:
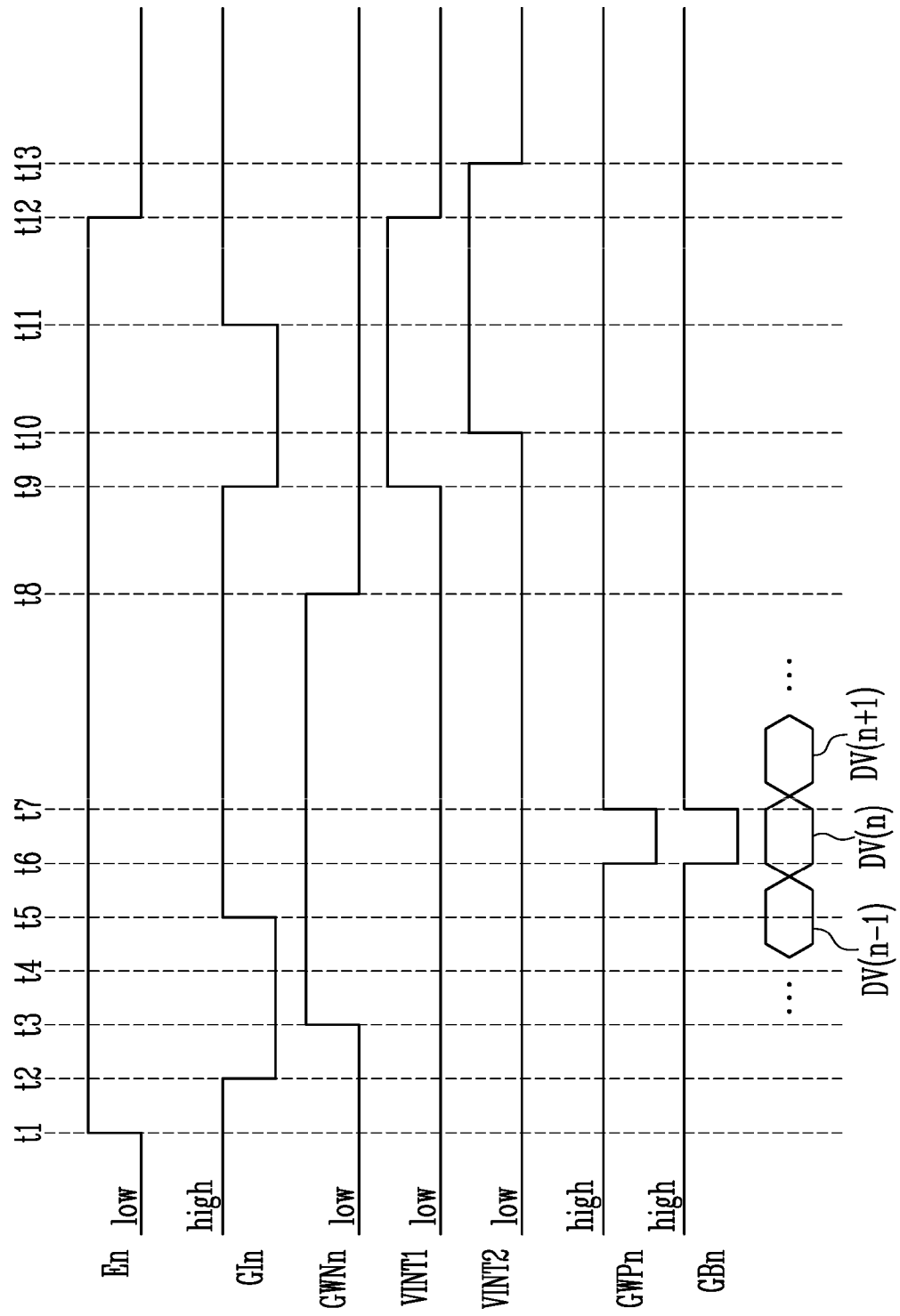
FIGS. 3 and 4 are timing diagrams for explaining a method of driving the pixel shown in FIG. 2.
Figure 4:
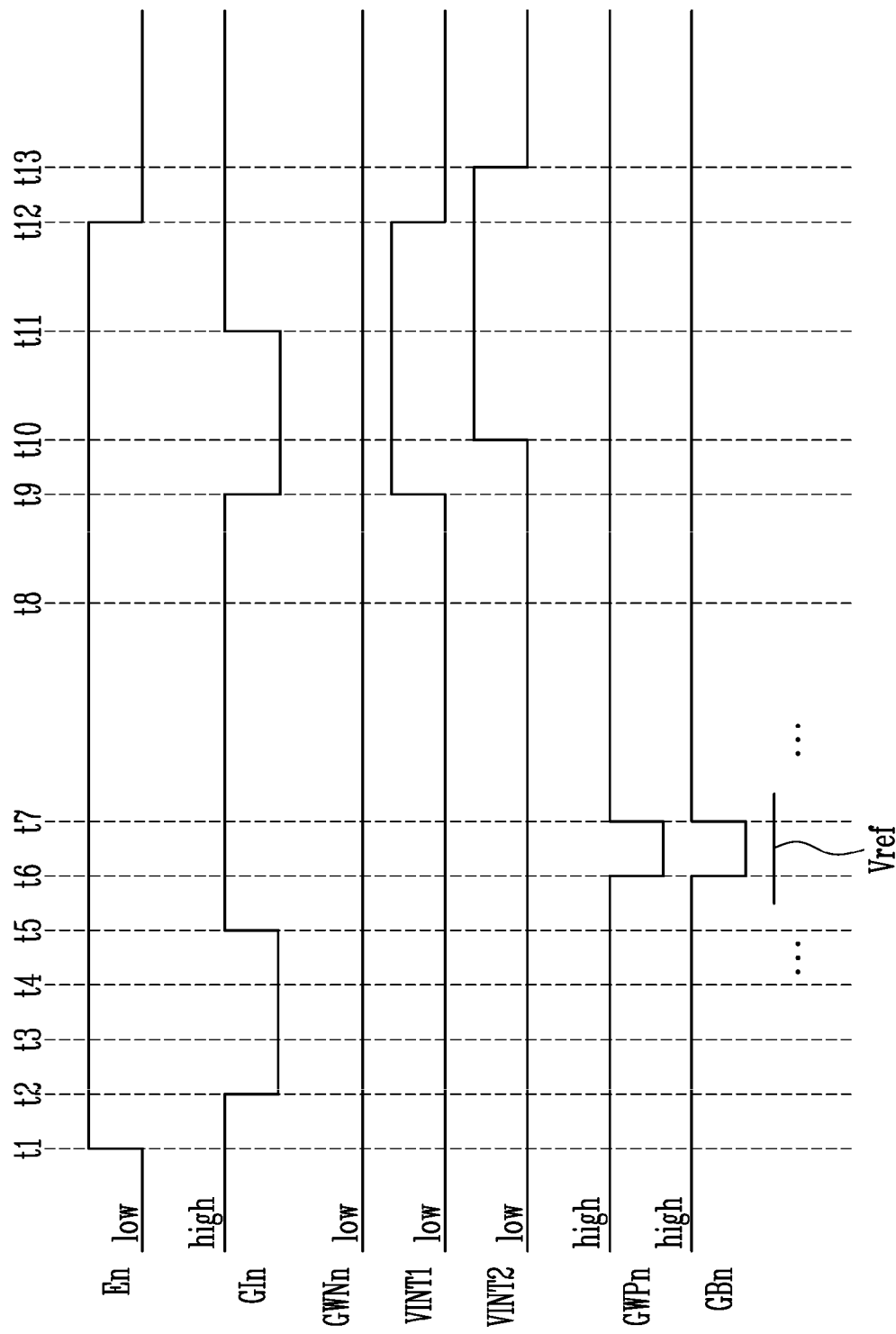

FIGS. 3 and 4 are timing diagrams for explaining a method of driving the pixel shown in FIG. 2. Specifically, FIG. 3 is a timing diagram for explaining a method of driving the pixel in the display scan period, and FIG. 4 is a timing diagram for explaining a method of driving the pixel in the self-scan period.

As described above with reference to FIG. 2, in FIGS. 3 and 4, a method of driving the pixel disposed on the n-th horizontal line and connected to the m-th data line DLm will be described for convenience of explanation.

Referring to FIGS. 2 and 3, the pixel PXnm may be supplied with signals for displaying an image during the display scan period. Here, the display scan period may include a period in which data signals DV(n−1), DV(n), and DV(n+1) that actually correspond to an output image are written.

In an embodiment, a voltage of a turn-on level of a second scan signal GWNn may be defined as the high level voltage. A voltage of the turn-on level of each of a first scan signal GIn, a third scan signal GWPn, and a fourth scan signal GBn may be defined as the low level voltage. Meanwhile, a voltage of the turn-on level of the emission control signal En may be defined as the low level voltage. However, this is an example. Pulse widths and logic levels of the scan signals and the emission control signal are not limited thereto, and may be changed according to a pixel structure, type of transistors, and the like.

First, the emission control signal En may be supplied to the emission control line Eln to interrupt current flow through the light emitting element LD. Here, a pulse width of the emission control signal En may be maintained from a first time point t1 to a twelfth time point t12. However, the present inventive concept is not limited thereto. The fifth transistor Tr5 and the sixth transistor Tr6 may be turned off by the emission control signal En. During a period in which the fifth transistor Tr5 and the sixth transistor Tr6 are turned off, supply of the driving current to the light emitting element LD may be stopped.

After the emission control signal En is supplied, the first scan signal GIn may be supplied. A pulse width of the first scan signal GIn may be maintained during a predetermined first period (for example, a period from a second time point t2 to a fifth time point t5). However, the present inventive concept is not limited thereto. Meanwhile, the fourth transistor Tr4 may be turned on by the first scan signal Gin.

After the first scan signal GIn is supplied, the second scan signal GWNn, may be supplied. A pulse width of the second scan signal GWNn may be maintained during a predetermined period (for example, a period from a third time point t3 to an eighth time point t8). However, the present inventive concept is not limited thereto. Meanwhile, the third transistor Tr3 is turned on by the second scan signal GWNn.

Here, when the third transistor Tr3 and the fourth transistor Tr4 are simultaneously turned on, as described above, the first initialization voltage VINT1 may be applied to the second node N2 through the first initialization voltage line VINTL1. Therefore, the gate electrode of the first transistor Tr1 may be initialized. In this case, the first initialization voltage VINT1 applied to the gate electrode of the first transistor Tr1 may be the same as, for example, the second power source voltage ELVSS. However, the present inventive concept is not limited thereto.

After the second scan signal GWNn is supplied, the supply of the first scan signal GIn is stopped at the fifth time point t5. That is, the first scan signal GIn of the turn-on level (for example, a low level) may be changed to a turn-off level (for example, a high level) at the fifth time point t5. In this case, the fourth transistor Tr4 may be turned off.

At a sixth time point t6, the third scan signal GWPn and the fourth scan signal GBn may be supplied. A pulse width of each of the third scan signal GWPn and the fourth scan signal GBn may be maintained during a predetermined period (for example, a period from the sixth time point t6 to a seventh time point t7). However, the present inventive concept is not limited thereto. Meanwhile, the second transistor Tr2 may be turned on by the third scan signal GWPn. When the second transistor Tr2 is turned on, an n-th data signal DV(n) may be supplied to the first node N1 through the data line DLm. Since the third transistor Tr3 is turned on, the first transistor Tr1 may be connected in the form of a diode. When the first transistor Tr1 is diode connected, a threshold voltage of the first transistor Tr1 may be compensated.

Meanwhile, the seventh transistor Tr7 may be turned on by the fourth scan signal GBn. When the seventh transistor Tr7 is turned on, the second initialization voltage VINT2 may be supplied to the fourth node N4. In this case, the second initialization voltage VINT2 may be the low level voltage. Accordingly, a voltage of the first electrode (for example, the anode electrode) of the light emitting element LD may be initialized, and a voltage of the parasitic capacitor formed in the light emitting element LD may be discharged (removed). That is, the period from the sixth time point t6 to the seventh time point t7 may be a data writing and light emitting diode initialization period.

The supply of each of the third scan signal GWPn and the fourth scan signal GBn may be stopped at the seventh time point t7. In this case, the second transistor Tr2 and the seventh transistor Tr7 may be turned off.

The supply of the second scan signal GWNn may be stopped at the eighth time point t8. In this case, the third transistor Tr3 may be turned off.

After the supply of the second scan signal GWNn is stopped, the first scan signal GIn may be supplied. In this case, the pulse width of the first scan signal GIn may be maintained during a predetermined second period (for example, a period from a ninth time point t9 to an eleventh time point t11). Meanwhile, the first initialization voltage VINT1 may be increased to a predetermined high level voltage in synchronized with the time point at which the first scan signal GIn is supplied (for example, the ninth time point t9). In an embodiment, a high level of the first initialization voltage VINT1 may be increased to be equal to or higher than a level of the first power source voltage ELVDD at the ninth time point t9. The fourth transistor Tr4 may be turned on by the first scan signal GIn. When the third transistor Tr3 is turned off and the fourth transistor Tr4 is turned on, a predetermined high voltage (an increased first initialization voltage) may be applied to the third node N3 as the bias voltage. In this case, the first transistor Tr1 may be in the on-bias state (that is, the first transistor Tr1 may be on-biased).

Meanwhile, since first transistors Tr1 of all the pixels arranged in an n-th pixel row are on-biased by the increased first initialization voltage, a difference in bias can be eliminated. Therefore, a difference in hysteresis of the pixels can be eliminated (reduced).

A turn-on period of the fourth transistor Tr4 and a turn-on period of each of the second transistor Tr2 and the seventh transistor Tr7 may not overlap. That is, an initialization period of the light emitting diode LD and a bias period may not be overlapped each other but be separated from each other.

Meanwhile, the supply of the first scan signal GIn may be stopped at the eleventh time point t11. At this time, the fourth transistor Tr4 may be turned off. In addition, the predetermined high voltage (the increased first initialization voltage) may also be reduced to a predetermined low level voltage in synchronized with the time point (for example, the twelfth time point t12) at which the supply of the emission control signal En is stopped. In this case, the first initialization voltage VINT1 may be the same voltage as the second power source voltage ELVSS.

Thereafter, at the twelfth time point t12, the supply of the emission control signal En may be stopped, and the fifth transistor Tr5 and the sixth transistor Tr6 may be turned on. When the fifth transistor Tr5 and the sixth transistor Tr6 are turned on, the driving current generated based on the data signal DV(n) may be supplied to the light emitting element LD, and the light emitting element LD may emit light at a luminance corresponding to the driving current. That is, a period after the twelfth time point t12 may be a light emitting period.

In an embodiment, one frame may include the display scan period. The display scan period may include the initialization period (for example, the period from the second time point t2 to the fifth time point t5), the data writing and light emitting diode initialization period (for example, the period from the sixth time point t6 to the seventh time t7), the bias period (for example, the period from the ninth time point t9 to the eleventh time point t11), and the light emitting period (for example, the period after the twelfth time point t12). Here, the remaining periods (the initialization period, the data writing and light emitting diode initialization period, and the bias period) other than the light emitting period in the display scan period may be a non-light emitting period of the pixel PXnm.

Meanwhile, referring to FIGS. 2 and 4, one frame may include at least one self-scan period according to the image frame rate.

In an embodiment, an operation of the self-scan period may be substantially the same as that of the display scan period, except that the second scan signal GWNn and the data signal DV(n) are not supplied. In the self-scan period, the data driver 20 may not supply various data signals DV(n−1), DV(n), and DV(n+1) to the pixels PXnm in the display area 50. Therefore, power consumption can be further reduced.

For example, the self-scan period may include a light emitting diode initialization period (for example, the period from the sixth time point t6 to the seventh time point t7), the bias period (for example, the period from the ninth time point t9 to the eleventh time point t11), and the light emitting period (for example, the period after the twelfth time point t12).

During the self-scan period, since the third transistor Tr3 maintains a turn-off state, the voltage applied to the gate electrode of the first transistor Tr1 (that is, the voltage applied to the second node N2) may not be affected by the driving of the self-scan period. That is, the data signal stored in the display scan period may maintain the voltage.

The emission control signal En, the first scan signal GIn, the third scan signal GWPn, and the fourth scan signal GBn may be supplied at the first frequency regardless of the image refresh rate. The second scan signal GWNn may be supplied at the second frequency corresponding to the image refresh rate.

In other words, the second transistor Tr2, and the fourth transistor Tr4 to the seventh transistor Tr7 may be driven at the first frequency, and the third transistor Tr3 may be driven at the second frequency lower than the first frequency.

Therefore, even when the image refresh rate changes, on-bias of the bias period may always be periodically applied. Accordingly, the change in hysteresis of the first transistor Tr1 for various image refresh rates may be minimized, and the flicker may be improved accordingly.

Referring to FIG. 4, the second scan signal GWNn may be a voltage of the turn-off level (for example, the low level). Meanwhile, the first scan signal GIn of the turn-on level (for example, the low level) may be supplied from the second time point t2 to the fifth time point t5. When the third transistor Tr3 is turned off and the fourth transistor Tr4 is turned on, the first initialization voltage VINT1 may be applied to the third node N3 to initialize the third node N3.

On the other hand, after the fifth time point t5, the supply of the first scan signal GIn may be stopped, and the third scan signal GWPn and the fourth scan signal GBn of the turn-on level (for example, the low level) may be supplied from the sixth time point t6 to the seventh time point t7. When the second transistor Tr2 is turned on, a reference voltage Vref may be applied to the first node N1 through the data line DLm. In this case, the reference voltage Vref may be a voltage supplied by the data driver 20. When the seventh transistor Tr7 is turned on, the second initialization voltage VINT2 may be applied to the fourth node N4 through the second initialization line VINTL2. Accordingly, the first node N1 and the fourth node N4 may be initialized. In this case, the second initialization voltage VINT2 may be the low level voltage.

In FIG. 4, the third scan signal GWPn is shown to be supplied from the sixth time point t6 to the seventh time point t7, but unlike the one shown in FIG. 4, the third scan signal GWPn may not be supplied in the self-scan period. In this case, the reference voltage Vref may also not be supplied to the data line DLm.

Meanwhile, the first scan signal GIn of the turn-on level (for example, the low level) may be supplied from the ninth time point t9 to the eleventh time point t11, and the first initialization voltage VINT1 may be increased to the predetermined high level voltage in synchronized with the ninth time point t9 at which the first scan signal GIn is supplied. In an embodiment, the first initialization voltage VINT1 may be increased to a voltage greater than the first power source voltage ELVDD at the ninth time point t9. When the third transistor Tr3 is turned off and the fourth transistor Tr4 is turned on, the predetermined high voltage (the increased first initialization voltage) may be applied to the drain electrode (and the source electrode) of the first transistor Tr1 (that is, the third node N3) as the bias voltage. In this case, the first transistor Tr1 may be in the on-bias state.

FIGS. 5 to 10 are timing diagrams illustrating embodiments of gate start pulses and light emitting start pulses according to an image refresh rate. FIG. 11 is a conceptual diagram for explaining a method of driving the display device 1 according to an image refresh rate.

Referring to FIGS. 5 to 10, output frequencies of the first gate start pulse GSP1, the third gate start pulse GSP3, and the fourth gate start pulse GSP4 for generating the first scan signal GI, the third scan signal GWP, and the fourth scan signal GB may be maintained as a constant frequencies, for example, at the first frequency regardless of the image refresh rate RR (or the driving frequency). For example, the output frequencies of the first gate start pulse GSP1, the third gate start pulse GSP3, and the fourth gate start pulse GSP4 may be set to twice the maximum image refresh rate RR of the display device 1.

In addition, an output frequency of the emission start pulse ESP for generating the emission control signal En may also be maintained as a constant frequency, for example, at the first frequency, regardless of the image refresh rate RR (or the driving frequency). The output frequency of the emission start pulse ESP may be set to twice the maximum image refresh rate RR of the display device 1.

Meanwhile, the output frequency of the second gate start pulse GSP2 for generating the second scan signal GWN may vary according to the image refresh rate RR.

In an embodiment, the timing controller 10 may output the second gate start pulse GSP2 at the same frequency (for example, the second frequency) as the image refresh rate RR.

In an embodiment, a pulse width of the emission start pulse ESP may be greater than pulse widths of the gate start pulses GSP1 to GSP4.

In an embodiment, both the emission start pulse ESP and the gate start pulses GSP1 to GSP4 may be output in the display scan period DSP. For example, each of the pixels PXnm may perform the driving shown in FIG. 3 during the display scan period DSP. In the display scan period DSP, each of the pixels PXnm may store the data signals corresponding to the image to be displayed.

In an embodiment, the emission start pulse ESP, the first gate start pulse GSP1, the third gate start pulse GSP3, and the fourth gate start pulse GSP4 may be output in the self-scan period SSP. For example, each of the pixels PXnm may perform the driving shown in FIG. 4 during the self-scan period SSP.

In the display scan period DSP and the self-scan period SSP, the predetermined high voltage (for example, the increased first initialization voltage) for applying bias to the first electrode and/or the second electrode of the first transistor Tr1 (shown in FIG. 2) of each of the pixels PXnm (shown in FIG. 2) may be supplied.

In an embodiment, the length of one display scan period DSP and the length of one self-scan period SSP may be substantially the same as each other. However, the number of self-scan periods SSP included in one frame period may be determined according to the image refresh rate RR.

Figure 5:
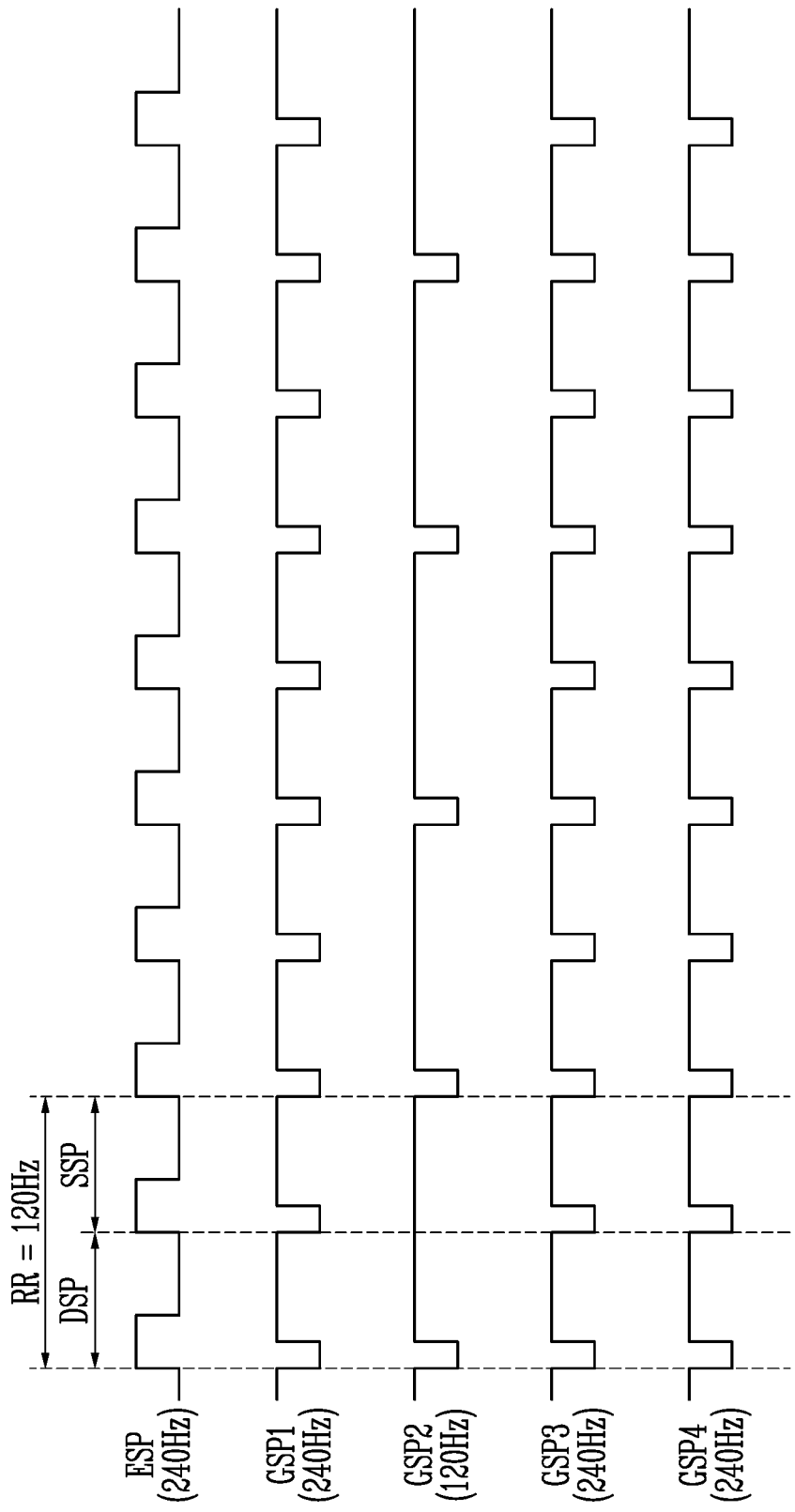
FIGS. 5 to 10 are timing diagrams illustrating embodiments of gate start pulses and light emitting start pulses according to an image refresh rate.

Referring to FIGS. 5 and 11, for example, when the display device 1 is driven at the image refresh rate RR of 120 Hz, the number of second gate start pulses GSP2 supplied during one frame period may be half of the number of first gate start pulses GSP1 (third gate start pulses GSP3 or fourth gate start pulses GSP4). Accordingly, for the image refresh rate RR of 120 Hz, one frame period may include one display scan period DSP and one self-scan period SSP.

Meanwhile, the emission start pulse ESP may be supplied at the same frequency as the first gate start pulse GSP1 (the third gate start pulse GSP3 or the fourth gate start pulse GSP4). When the display device 1 is driven at the image refresh rate RR of 120 Hz, each of the pixels PXnm may alternately repeat light emitting and non-light emitting operations twice during the frame period.

Figure 6:
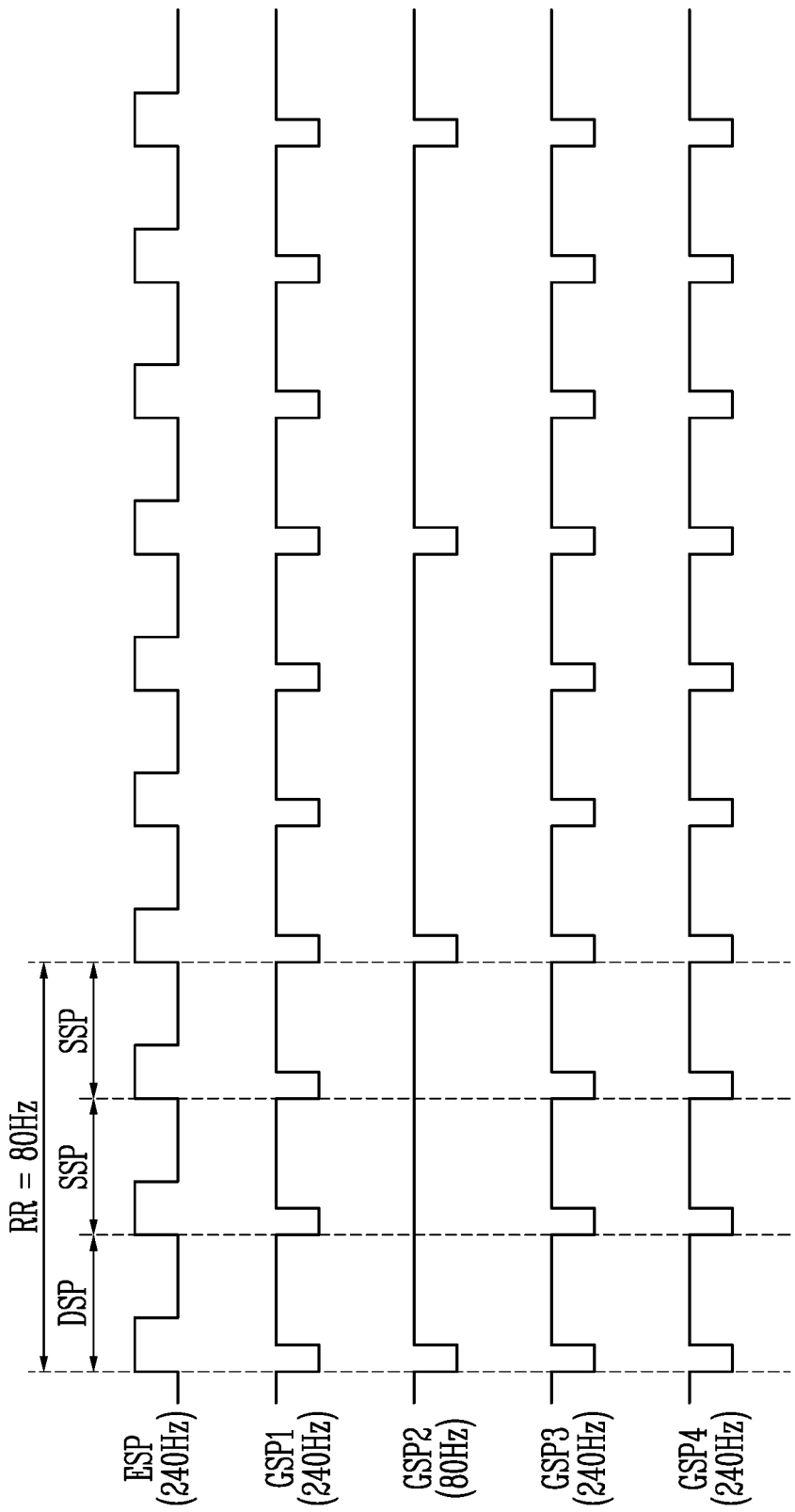

Referring to FIGS. 6 and 11, for example, when the display device 1 is driven at the image refresh rate RR of 80 Hz, the number of second gate start pulses GSP2 supplied during one frame period may be ⅓ of the number of first gate start pulses GSP1 (third gate start pulses GSP3 or fourth gate start pulses GSP4). Accordingly, when driven at the image refresh rate RR of 80 Hz, one frame period may include one display scan period DSP and two consecutive self-scan periods SSP.

Meanwhile, the emission start pulse ESP may be supplied at the same frequency as the first gate start pulse GSP1 (the third gate start pulse GSP3 or the fourth gate start pulse GSP4). Thus, each of the pixels PXnm may alternately repeat the light emitting and non-light emitting operations three times.

Figure 7:
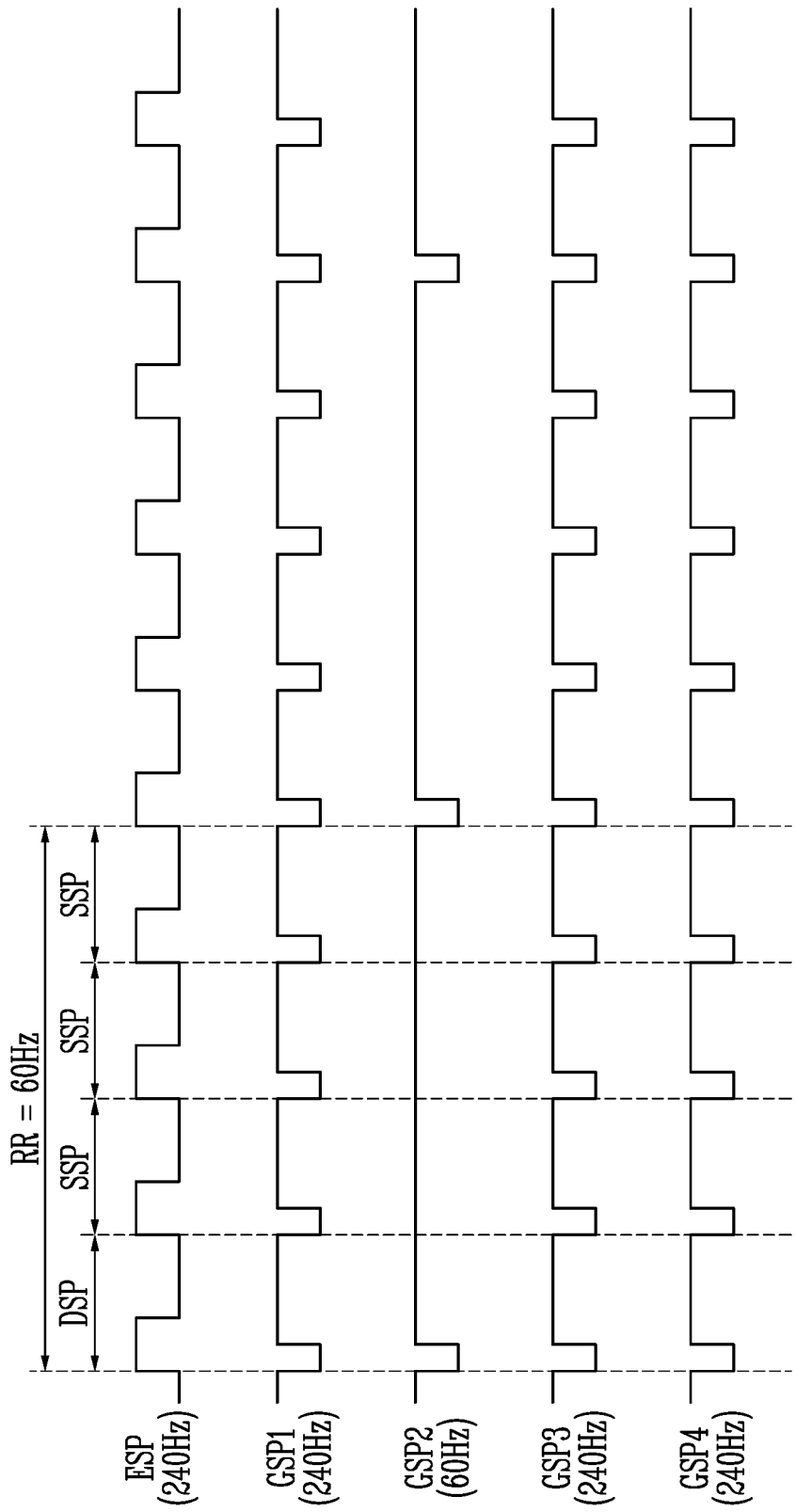

Referring to FIGS. 7 and 11, for example, when the display device 1 is driven at the image refresh rate RR of 60 Hz, the number of second gate start pulses GSP2 supplied during one frame period may be ¼ of the number of first gate start pulses GSP1 (third gate start pulses GSP3 or fourth gate start pulses GSP4). Accordingly, when driven at the image refresh rate RR of 60 Hz, one frame period may include one display scan period DSP and three consecutive self-scan periods SSP.

Meanwhile, the emission start pulse ESP may be supplied at the same frequency as the first gate start pulse GSP1 (the third gate start pulse GSP3 or the fourth gate start pulse GSP4). Thus, each of the pixels PXnm may alternately repeat the light emitting and non-light emitting operations four times.

Figure 8:
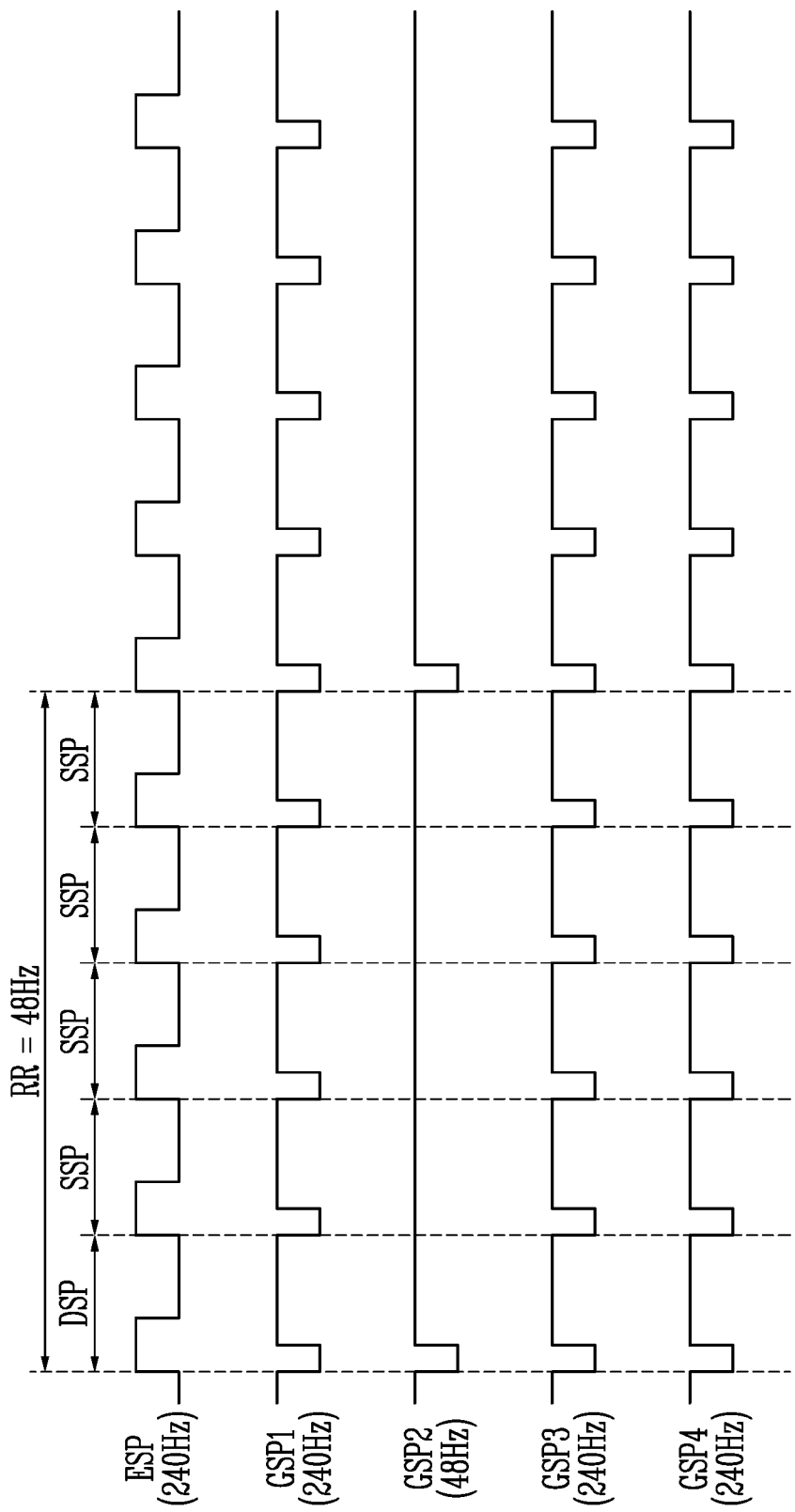

Referring to FIGS. 8 and 11, for example, when the display device 1 is driven at the image refresh rate RR of 48 Hz, the number of second gate start pulses GSP2 supplied during one frame period may be ⅕ of the number of first gate start pulses GSP1 (third gate start pulses GSP3 or fourth gate start pulses GSP4). Accordingly, when driven at the image refresh rate RR of 48 Hz, one frame period may include one display scan period DSP and four consecutive self-scan periods SSP.

Meanwhile, the emission start pulse ESP may be supplied at the same frequency as the first gate start pulse GSP1 (the third gate start pulse GSP3 or the fourth gate start pulse GSP4). Thus, each of the pixels PXnm may alternately repeat the light emitting and non-light emitting operations five times.

Figure 9:
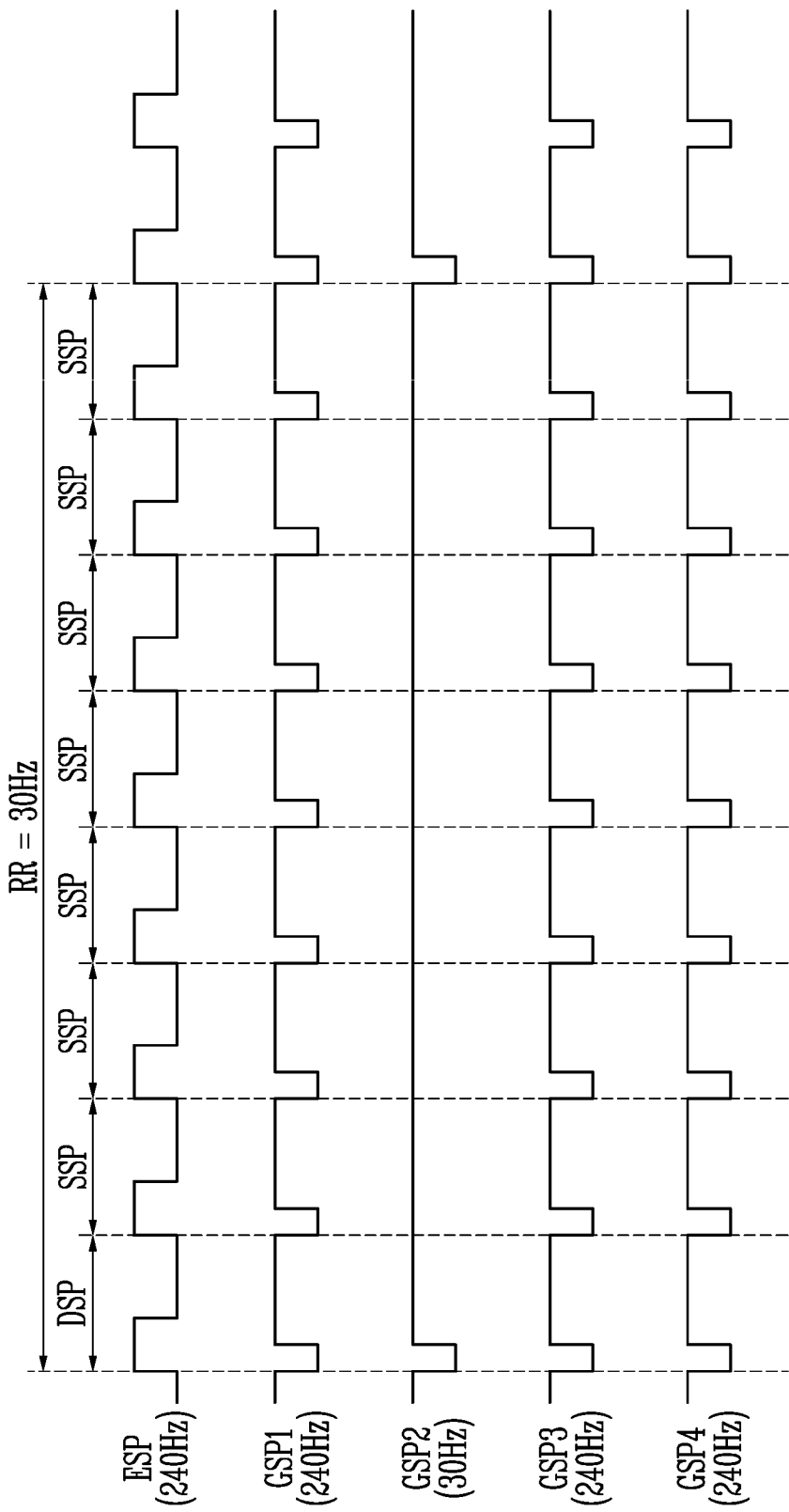

Referring to FIGS. 9 and 11, for example, when the display device 1 is driven at the image refresh rate RR of 30 Hz, the number of second gate start pulses GSP2 supplied during one frame period may be ⅛ of the number of first gate start pulses GSP1 (third gate start pulses GSP3 or fourth gate start pulses GSP4). Accordingly, when driven at the image refresh rate RR of 30 Hz, one frame period may include one display scan period DSP and seven consecutive self-scan periods SSP.

Meanwhile, the emission start pulse ESP may be supplied at the same frequency as the first gate start pulse GSP1 (the third gate start pulse GSP3 or the fourth gate start pulse GSP4). Thus, each of the pixels PXnm may alternately repeat the light emitting and non-light emitting operations eight times.

Figure 10:
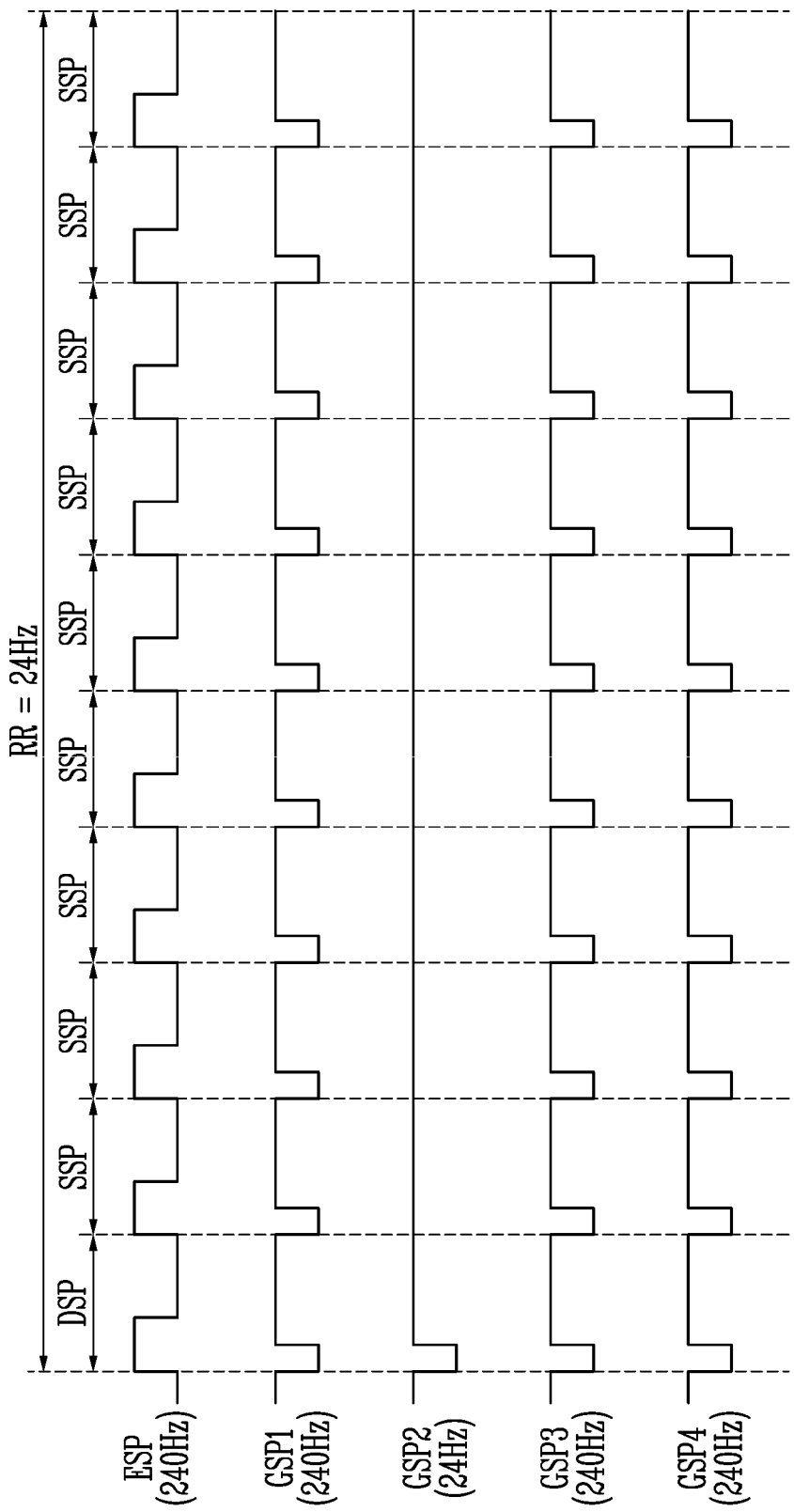
Figure 11:
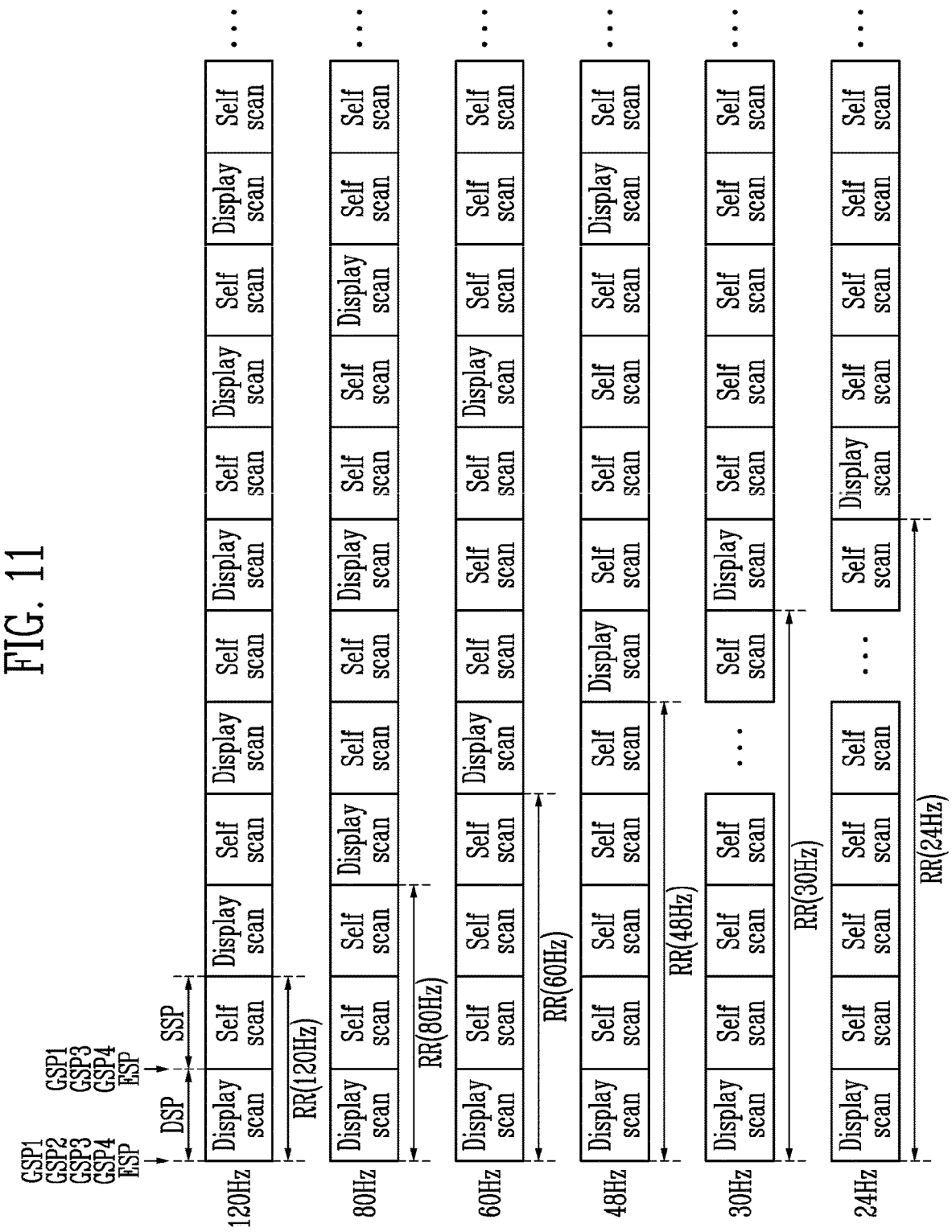
FIG. 11 is a conceptual diagram for explaining a method of driving the display device according to an image refresh rate.

Referring to FIGS. 10 and 11, for example, when the display device 1 is driven at the image refresh rate RR of 24 Hz, the number of second gate start pulses GSP2 supplied during one frame period may be 1/10 of the number of first gate start pulses GSP1 (third gate start pulses GSP3 or fourth gate start pulses GSP4). Accordingly, when driven at the image refresh rate RR of 24 Hz, one frame period may include one display scan period DSP and nine consecutive self-scan periods SSP.

Meanwhile, the emission start pulse ESP may be supplied at the same frequency as the first gate start pulse GSP1 (the third gate start pulse GSP3 or the fourth gate start pulse GSP4). Thus, each of the pixels PXnm may alternately repeat the light emitting and non-light emitting operations ten times.

In a manner similar to that described above, the display device 1 may be driven at the driving frequency of 60 Hz, 30 Hz, 24 Hz, 12 Hz, 8 Hz, 6 Hz, 5 Hz, 4 Hz, 3 Hz, 2 Hz, 1 Hz, or the like by adjusting the number of self-scan periods SSP included in one frame period. In other words, the display device 1 may support various image refresh rates RR at frequencies corresponding to a divisor of the first frequency.

Also, since the number of self-scan periods SSP increases as the driving frequency decreases, the on-bias having a constant size may be periodically applied to each of the first transistors Tr1 included in the display area 50. Therefore, luminance reduction, flicker (flickering), and screen dragging can be improved in the low frequency driving.

Figure 12:
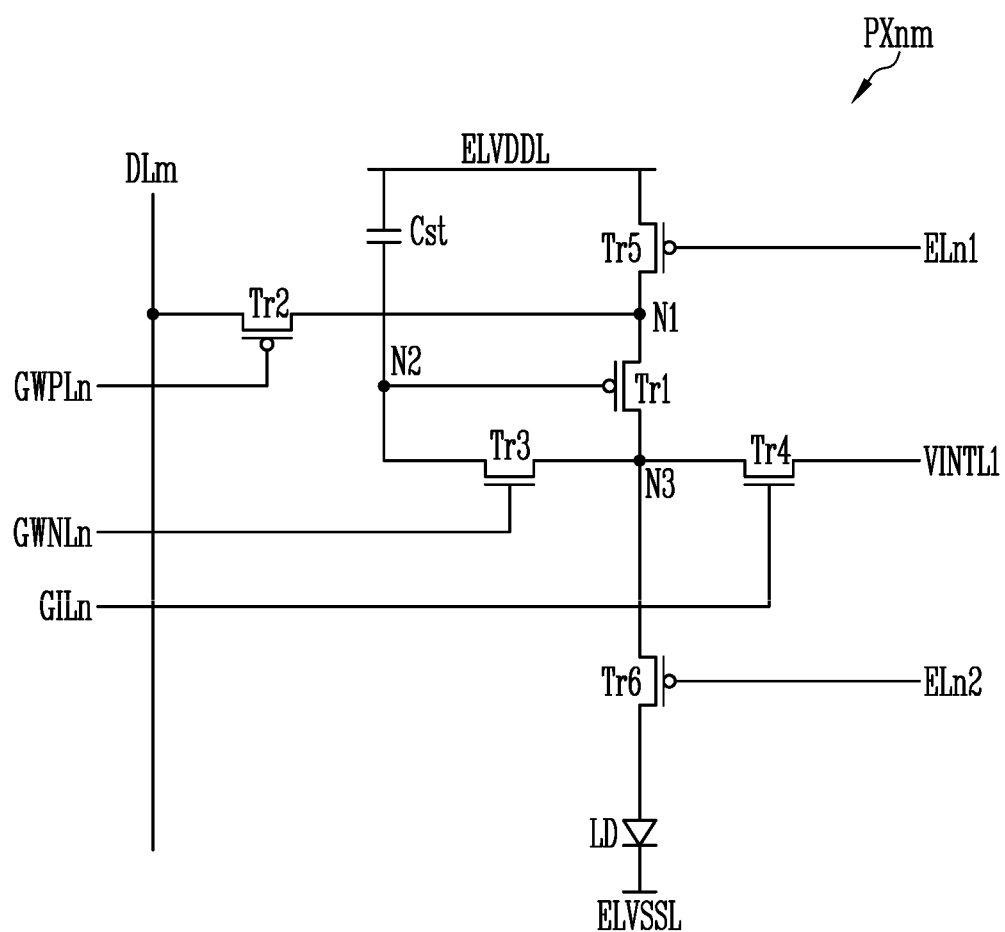
FIG. 12 is a circuit diagram of a pixel according to another embodiment of the present inventive concept.

FIG. 12 is a circuit diagram of a pixel according to another embodiment of the present inventive concept.

As described above with reference to FIG. 2, in FIG. 12, a pixel disposed on the n-th horizontal line and connected to the m-th data line DLm is shown for convenience of explanation. Hereinafter, the description of the same components shown in FIG. 2 will be omitted and the present inventive concept will be mainly described based on differences.

Referring to FIG. 12, a pixel PXnm shown in FIG. 12 may be connected to the first power source line ELVDDL, the second power source line ELVSSL, a first emission control line ELn1, a second emission control line ELn2, the first initialization voltage line VINTL1, the scan lines GILn, GWNLn, and GWPLn, and the data line DLm.

The pixel PXnm may include the transistors Tr1 to Tr6, the storage capacitor Cst, and the light emitting diode LD.

Since the first transistor Tr1, the second transistor Tr2, the third transistor Tr3, the storage capacitor Cst, and the light emitting diode LD are the same as shown in FIG. 2, descriptions thereof are omitted.

The fourth transistor Tr4 may be connected between the third node N3 and the first initialization voltage line VINTL1. That is, the first electrode of the fourth transistor Tr4 may be connected to the third node N3, the second electrode of the fourth transistor Tr4 may be connected to the first initialization voltage line VINTL1, and the gate electrode of the fourth transistor Tr4 may be connected to the first scan line GILn. The fourth transistor Tr4 may be turned on when the first scan signal having the turn-on level pulse is supplied to the first scan line GILn to supply the first initialization voltage applied through the first initialization voltage line VINTL1 to the third node N3.

Here, as described above with reference to FIGS. 2 to 4, when the third transistor Tr3 and the fourth transistor Tr4 are turned on, the gate electrode of the first transistor Tr1 may be initialized by the first initialization voltage applied to the third node N3.

Meanwhile, as described above with reference to FIGS. 2 to 4, when the third transistor Tr3 is turned off and the fourth transistor Tr4 is turned on, the predetermined high voltage (the increased first initialization voltage VINT) may be applied to the drain electrode (and the source electrode) of the first transistor Tr1 (that is, the third node N3) as the bias voltage. In this case, the first transistor Tr1 may be in the on-bias state.

The fifth transistor Tr5 may be connected between the first power source line ELVDDL and the first node N1. The gate electrode of the fifth transistor Tr5 may be connected to the first emission control line ELn1. The fifth transistor Tr5 may be turned off when the first emission control signal is supplied to the first emission control line ELn1 and may be turned on in other cases.

The sixth transistor Tr6 may be connected between the second electrode of the first transistor Tr1 (that is, the third node N3) and the first electrode of the light emitting diode LD. The gate electrode of the sixth transistor Tr6 may be connected to the second emission control line ELn2. The sixth transistor Tr6 may be turned off when the second emission control signal is supplied to the second emission control line ELn2 and may be turned on in other cases.

In an embodiment, the third transistor Tr3 and the fourth transistor Tr4 may include the active layer formed of the oxide such as In—Ga—Zn-Oxygen (IGZO). That is, the third transistor Tr3 and the fourth transistor Tr4 may be the oxide semiconductor transistors. In addition, the first transistor Tr1, the second transistor Tr2, the fifth transistor Tr5 and the sixth transistor Tr6 may include the active layer (channel) formed through the low temperature poly-silicon (LTPS) process. That is, the first transistor Tr1, the second transistor Tr2, the fifth transistor Tr5 and the sixth transistor Tr6 may be the polysilicon semiconductor transistors.

Hereinafter, a method of driving the pixel according to another embodiment of the present inventive concept will be described in detail with reference to timing diagrams.

FIGS. 13 and 14 are timing diagrams for explaining a method of driving the pixel shown in FIG. 12. Specifically, FIG. 13 is a timing diagram for explaining a method of driving the pixel in the display scan period, and FIG. 14 is a timing diagram for explaining a method of driving the pixel in the self-scan period.

As described above with reference to FIG. 12, in FIGS. 13 and 14, a method of driving the pixel disposed on the n-th horizontal line and connected to the m-th data line DLm will be described for convenience of explanation.

Referring to FIGS. 12 and 13, the pixel PXnm may be supplied with signals for displaying an image during the display scan period. Here, the display scan period may include a period in which the data signals DV(n−1), DV(n), and DV(n+1) that actually correspond to an output image are written.

In an embodiment, a voltage of the turn-on level of each of the first scan signal GIn and the second scan signal GWNn may be defined as the high level voltage, and a voltage of the turn-on level of the third scan signal GWPn may be defined as the low level voltage. Meanwhile, a voltage of the turn-on level of the emission control signals En1 and En2 may be defined as the low level voltage.

However, this is an example. Pulse widths and logic levels of the scan signals and the emission control signals are not limited thereto, and may be changed according to a pixel structure, a type of transistors, and the like.

First, the first emission control signal En1 may be supplied to the first emission control line ELn1. Here, the pulse width of the first emission control signal En1 may be maintained from the first time point t1 to the ninth time point t9. However, the present inventive concept is not limited thereto. The fifth transistor Tr5 may be turned off by the first emission control signal En1. During the period at which the fifth transistor Tr5 is turned off, the supply of the driving current to the light emitting element LD may be stopped.

After the first emission control signal En1 is supplied, the first scan signal GIn may be supplied. The pulse width of the first scan signal GIn may be maintained during a predetermined period (for example, a period from the second time point t2 to the fourth time point t4). However, the present inventive concept is not limited thereto. Meanwhile, the fourth transistor Tr4 may be turned on by the first scan signal Gin.

Meanwhile, the second scan signal GWNn may be supplied in synchronized with the time point at which the first scan signal GIn is supplied (for example, the second time point t2). Here, the second scan signal GWNn may be maintained from the second time point t2 to the seventh time point t7. However, the present inventive concept is not limited thereto. The third transistor Tr3 may be turned on by the second scan signal GWNn.

Meanwhile, the second emission control signal En2 may not be supplied until a specific time point (for example, the third time point t3). In this case, the sixth transistor Tr6 may be turned on.

Here, when the third transistor Tr3, the fourth transistor Tr4, and the sixth transistor Tr6 are turned on, the gate electrode of the first transistor Tr1 and the first electrode of the light emitting diode LD may be initialized by the first initialization voltage VINT1. In this case, the first initialization voltage VINT1 may be, for example, the same as the second power source voltage ELVSS. However, the present inventive concept is not limited thereto. The period from the second time point t2 to the third time point t3 may be the initialization period.

The second emission control signal En2 may be supplied at the third time point t3. The pulse width of the second emission control signal En2 may be maintained from the third time point t3 to the ninth time point t9. However, the present inventive concept is not limited thereto. The sixth transistor Tr6 may be turned off by the second emission control signal En2.

After the time point at which the second emission control signal En2 is supplied (for example, the third time point t3), the supply of the first scan signal GIn may be stopped. In this case, the fourth transistor tr4 may be turned off.

After the time point at which the supply of the first scan signal GIn is stopped (for example, the fourth time point t4), the third scan signal GWPn may be supplied. The pulse width of the third scan signal GWPn may be maintained for a predetermined period (for example, a period from the fifth time point t5 to the sixth time point t6). However, the present inventive concept is not limited thereto.

Meanwhile, the second transistor Tr2 may be turned on by the third scan signal GWPn. When the second transistor Tr2 is turned on, the n-th data signal DV(n) may be supplied to the first node N1 through the data line DLm. Since the third transistor Tr3 is turned on, the first transistor Tr1 may be diode connected. That is, the period from the fifth time point t5 to the sixth time point t6 may be a data writing and threshold voltage compensation period.

The supply of the third scan signal GWPn may be stopped at the sixth time point t6. In this case, the second transistor Tr2 may be turned off. Then, the supply of the second scan signal GWNn may be stopped at the seventh time point t7. In this case, the third transistor Tr3 may be turned off.

After the time point at which the supply of the second scan signal GWNn is stopped (for example, the seventh time point t7), the first scan signal GIn may be supplied. The first initialization voltage VINT1 may be increased to the predetermined high level voltage in synchronized with the time point at which the first scan signal GIn is supplied (for example, the eighth time point t8). In an embodiment, the high level of the first initialization voltage VINT1 may be increased to be equal to or higher than the level of the first power source voltage ELVDD at the eighth time t8. Meanwhile, the fourth transistor Tr4 may be turned on by the first scan signal Gin. When the third transistor Tr3 is turned off and the fourth transistor Tr4 is turned on, the predetermined high voltage (the increased first initialization voltage) may be applied to the third node N3 as the bias voltage. In this case, the first transistor Tr1 may be in the on-bias state.

Meanwhile, since the first transistors Tr1 of all the pixels arranged in the n-th pixel row are on-biased by the increased first initialization voltage, the difference in bias can be eliminated. Therefore, the difference in hysteresis of the pixels can be eliminated (reduced).

Meanwhile, at the ninth time point t9, the supply of the emission control signals En1 and En2 and the scan signals GIn and GWNn is stopped, and the predetermined high voltage (the increased first initialization voltage) may also be reduced to the predetermined low level voltage. In this case, the first initialization voltage VINT1 may be the same voltage as the second power source voltage ELVSS.

After the ninth time point t9, the fifth transistor Tr5 and the sixth transistor Tr6 may be turned on. When the fifth transistor Tr5 and the sixth transistor Tr6 are turned on, the driving current generated based on the data signal DV(n) may be supplied to the light emitting element LD, and the light emitting element LD may emit light at a luminance corresponding to the driving current. That is, the period after the ninth time point t9 may be the light emitting period.

In an embodiment, one frame may include the display scan period. The display scan period may include the initialization period (for example, the period from the second time point t2 to the third time point t3), the data writing and threshold voltage compensation period (for example, the period from the fifth time point t5 to the sixth time point t6), the bias period (for example, the period from the eighth time point t8 to the ninth time point t9), and the light emitting period (for example, the period after the ninth time point t9). Here, the remaining periods (the initialization period, the data writing and light emitting diode initialization period, and the bias period) other than the light emitting period in the display scan period may be the non-light emitting period of the pixel PXnm.

Meanwhile, referring to FIGS. 12 and 14, one frame may include at least one self-scan period according to the image frame rate.

In an embodiment, an operation of the self-scan period shown in FIG. 14 may be substantially the same as that of the display scan period shown in FIG. 13 except that the second scan signal GWNn, the third scan signal GWPn, the reference voltage Vref (shown in FIG. 4), and the data signal DV(n) are not supplied. In the self-scan period, the data driver 20 may not supply the data signals DV(n−1), DV(n), and DV(n+1) to the display area 50. Therefore, power consumption can be further reduced.

In FIG. 14, the third scan signal GWPn is not supplied. However, different from that shown in FIG. 14, and similar to that shown in FIG. 4, the third scan signal GWPn of the turn-on level (for example, the low level) may be supplied from the sixth time point t6 to the seventh time point t7. When the second transistor Tr2 is turned on by the third scan signal GWPn of the turn-on level (for example, the low level), the reference voltage Vref may be applied to the first node N1 through the data line DLm as disclosed in FIG. 4. In this case, the reference voltage Vref may be the voltage supplied by the data driver 20.

In an embodiment, the emission control signals En1 and En2, the first scan signal GIn, and the third scan signal GWPn may be supplied at the first frequency regardless of the image refresh rate, and the second scan signal GWNn may be supplied at the second frequency corresponding to the image refresh rate.

In other words, the second transistor Tr2 and the fourth transistor Tr4 to the sixth transistor Tr6 may be driven at the first frequency, and the third transistor Tr3 may be driven at the second frequency lower than the first frequency.

Therefore, even when the image refresh rate changes, the on-bias of the bias period may always be periodically applied to the third node N3. Accordingly, the change in hysteresis of the first transistor Tr1 due to different image refresh rates may be minimized, and the flicker may be improved accordingly.

As described above, the embodiments of the present inventive concept can minimize the difference in luminance even when the driving frequency is changed.

In addition, the embodiments of the present inventive concept may periodically apply the bias of the constant voltage to the driving transistor regardless of the data signal and the grayscale of the image. Therefore, the hysteresis (the difference in threshold voltage shift) due to the difference in on-bias (and the difference in grayscale) between adjacent pixels and the screen dragging (ghost phenomenon) due to the deviation in hysteresis can be improved (removed).

The effects according to the embodiments are not limited by the contents described above, and more various effects are included in the present specification.

As described above, the exemplary embodiments of the present inventive concept have been described with reference to the accompanying drawings. Those skilled in the art to which the present inventive concept pertains will appreciate that various modifications and equivalent embodiments are possible without changing the technical spirit or essential features of the present inventive concept. Therefore, it is to be understood that the exemplary embodiments as described above have been disclosed for illustrative purposes only and are not intended to limit the scope of the inventive concept.

What is claimed is:

1. A display device comprising:
   pixels connected to first scan lines, second scan lines, third scan lines, data lines, and emission control lines; and
   an initialization voltage supply circuit supplying an initialization voltage to the pixels,
   wherein each of the pixels includes:
   a light emitting diode;
   a first transistor including a first electrode connected to a first node that is electrically connected to a first power source line, a gate electrode connected to a second node, and a second electrode connected to a third node;
   a second transistor connected between a data line and the first node, and including a gate electrode connected to a third scan line;
   a third transistor connected between the second node and the third node, and including a gate electrode connected to a second scan line; and
   a fourth transistor connected between the third node and a first initialization voltage line, and including a gate electrode connected to a first scan line,
   wherein the fourth transistor is turned on during a first period and a second period,
   wherein the initialization voltage supply circuit supplies a first initialization voltage of a first level during the first period, and supplies the first initialization voltage of a second level higher than the first level during the second period, and
   wherein the second level of the first initialization voltage is equal to or higher than a level of a first power source voltage supplied to the first power source line.

2. The display device of claim 1, wherein the each of the pixels further includes:
   a fifth transistor connected between the first power source line and the first node and including a gate electrode connected to an emission control line; and
   a sixth transistor connected between the third node and a fourth node that is connected to a first electrode of the light emitting diode and including a gate electrode connected to the emission control line.

3. The display device of claim 2,
   wherein a first scan signal having a turn-on level is supplied to the first scan line during the first period after the emission control signal having a turn-off level is supplied to the fifth transistor and the sixth transistor,
   wherein a second scan signal having the turn-on level is supplied to the second scan line during a period overlapping at least a portion of the first period, and wherein the first initialization voltage of the first level is applied to the second node during a period in which the first scan signal and the second scan signal having the turn-on level are supplied.

4. The display device of claim 3, wherein a third scan signal having the turn-on level is supplied to the third scan line during a period between the first period and the second period, and
wherein a data signal is applied to the first node during a period in which the third scan signal having the turn-on level is supplied.

5. The display device of claim 4, wherein the supply of the second scan signal having the turn-on level is stopped after the period in which the third scan signal having the turn-on level is supplied, and
wherein the first scan signal having the turn-on level is supplied during the second period after the supply of the second scan signal having the turn-on level is stopped.

6. The display device of claim 5, wherein the first initialization voltage is changed from the first level to the second level in synchronized with a time when the first scan signal having the turn-on level is supplied.

7. The display device of claim 2, wherein the each of the pixels further includes a seventh transistor connected between the fourth node and a second initialization voltage line, and including a gate electrode connected to a fourth scan line.

8. The display device of claim 7, wherein a fourth scan signal having the turn-on level is supplied to the fourth scan line after the first period, and
wherein a second initialization voltage is applied to the fourth node through the second initialization voltage line in a period in which the fourth scan signal having the turn-on level is supplied.

9. The display device of claim 8, wherein the fourth scan signal is the same as the third scan signal.

10. The display device of claim 2, wherein the third transistor is an oxide semiconductor transistor, and
wherein the first transistor, the second transistor, the fourth transistor, the fifth transistor, and the sixth transistor are polysilicon semiconductor transistors.

11. The display device of claim 1, wherein the emission control line includes a first emission control line and a second emission control line, and
wherein the each of the pixels further includes:
a fifth transistor connected between the first power source line and the first node and including a gate electrode connected to the first emission control line; and
a sixth transistor connected between the third node and the first electrode of the light emitting diode and including a gate electrode connected to the second emission control line.

12. The display device of claim 11,
wherein the first scan signal having the turn-on level is supplied to the first scan line during the first period after the first emission control signal having a turn-off level is supplied to the fifth transistor,
wherein the second scan signal having the turn-on level is supplied to the second scan line during a period overlapping at least a portion of the first period,
wherein a second emission control signal having the turn-off level is supplied to the second emission control line during a period overlapping at least a portion of the first period, and wherein the first initialization voltage having the first level is applied to the second node and the first electrode of the light emitting diode during a period in which the first scan signal, the second scan signal and the second emission control signal having the turn-on level is supplied.

13. The display device of claim 12, wherein the third scan signal having the turn-on level is supplied to the third scan line during a period between the first period and the second period, and
wherein the data signal is applied to the first node during the period in which the third scan signal having the turn-on level is supplied.

14. The display device of claim 13, wherein the supply of the second scan signal having the turn-on level is stopped after the period in which the third scan signal having the turn-off level is supplied, and
wherein the first scan signal having the turn-on level is supplied during the second period after the supply of the second scan signal having the turn-on level is stopped.

15. The display device of claim 14, wherein the first initialization voltage is changed from the first level to the second level in synchronized with when the first scan signal is supplied.

16. The display device of claim 11, wherein the third transistor and the fourth transistor are oxide semiconductor transistors, and
wherein the first transistor, the second transistor, the fifth transistor, and the sixth transistor are polysilicon semiconductor transistors.

17. The display device of claim 1, further comprising:
a first sub-scan driver for sequentially supplying first scan signals to the first scan lines at a first frequency;
a second sub-scan driver for sequentially supplying second scan signals to the second scan lines at a second frequency;
a third sub-scan driver for sequentially supplying third scan signals to the third scan lines at the first frequency; and
a fourth sub-scan driver for sequentially supplying fourth scan signals to the fourth scan lines at the first frequency.

18. The display device of claim 17, wherein the first sub-scan driver supplies a first scan signal during a display scan period and a self-scan period included in one frame period,
wherein the second sub-scan driver supplies a second scan signal during the display scan period and does not supply the second scan signal during the self-scan period,
wherein the third sub-scan driver supplies a third scan signal during the display scan period and the self-scan period, and
wherein the fourth sub-scan driver supplies a fourth scan signal during the display scan period and the self-scan period.

19. The display device of claim 18, wherein the first frequency is a multiple of the second frequency, and
wherein the second frequency is a frequency corresponding to an image refresh rate of the pixels.

* * * * *